United States Patent
Li et al.

(10) Patent No.: US 8,969,933 B2
(45) Date of Patent: Mar. 3, 2015

(54) REPLACEMENT GATE MOSFET WITH A HIGH PERFORMANCE GATE ELECTRODE

(71) Applicant: International Business Machines Corporation, Armonk, NY (US)

(72) Inventors: Zhengwen Li, Danbury, CT (US); Dechao Guo, Wappinger Falls, NY (US); Randolph F. Knarr, Albany, NY (US); Chengwen Pei, Danbury, CT (US); Gan Wang, Fishkill, NY (US); Yanfeng Wang, Fishkill, NY (US); Keith Kwong Hon Wong, Wappingers Falls, NY (US); Jian Yu, Danbury, CT (US); Jun Yuan, San Diego, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/780,877

(22) Filed: Feb. 28, 2013

(65) Prior Publication Data

US 2013/0175641 A1  Jul. 11, 2013

Related U.S. Application Data

(62) Division of application No. 12/912,963, filed on Oct. 27, 2010, now Pat. No. 8,592,266.

(51) Int. Cl.
*H01L 29/76* (2006.01)
*H01L 29/78* (2006.01)
*H01L 29/423* (2006.01)
*H01L 29/49* (2006.01)
*H01L 29/66* (2006.01)

(52) U.S. Cl.
CPC .......... *H01L 29/78* (2013.01); *H01L 29/42368* (2013.01); *H01L 29/49* (2013.01); *H01L 29/66545* (2013.01); *H01L 29/6659* (2013.01); *H01L 29/66606* (2013.01); *H01L 29/7833* (2013.01)
USPC ........... 257/288; 257/330; 257/332; 438/197; 438/270

(58) Field of Classification Search
USPC ......... 257/288, 330, 332, 334, 341, 900, 331, 257/773; 438/591, 135, 270, 197, 443, 425, 438/269, 700, 272, 259
See application file for complete search history.

(56) References Cited

U.S. PATENT DOCUMENTS

| | | | |
|---|---|---|---|
| 7,071,086 B2 | 7/2006 | Woo et al. | |
| 7,422,936 B2 | 9/2008 | Barns et al. | |
| 2001/0026000 A1* | 10/2001 | Matsuoka | 257/412 |
| 2007/0063272 A1 | 3/2007 | Arena et al. | |
| 2007/0141798 A1 | 6/2007 | Bohr | |
| 2009/0004815 A1 | 1/2009 | Hong | |
| 2009/0302380 A1 | 12/2009 | Graf et al. | |
| 2009/0321817 A1* | 12/2009 | Hunt | 257/330 |
| 2010/0117147 A1* | 5/2010 | Kim et al. | 257/330 |

* cited by examiner

*Primary Examiner* — Thanh Y Tran
(74) *Attorney, Agent, or Firm* — Scully, Scott, Murphy & Presser, P.C.; H. Daniel Schnurmann

(57) ABSTRACT

In a replacement gate scheme, a continuous material layer is deposited on a bottom surface and a sidewall surface in a gate cavity. A vertical portion of the continuous material layer is removed to form a gate component of which a vertical portion does not extend to a top of the gate cavity. The gate component can be employed as a gate dielectric or a work function metal portion to form a gate structure that enhances performance of a replacement gate field effect transistor.

8 Claims, 20 Drawing Sheets

REPLACEMENT GATE MOSFET WITH A HIGH PERFORMANCE GATE ELECTRODE

CROSS REFERENCE TO RELATED APPLICATION

This application is a divisional of U.S. patent application Ser. No. 12/912,963, filed Oct. 27, 2010 the entire content and disclosure of which is incorporated herein by reference.

BACKGROUND

The present disclosure relates to semiconductor structures, and particularly to a metal-oxide-semiconductor field effect transistor (MOSFET) having a high performance replacement gate electrode configured to provide reduced parasitic capacitance and/or low resistance, and methods of manufacturing the same.

A replacement gate metal-oxide-semiconductor field effect transistor (MOSFET) can accommodate a high dielectric constant (high-k) gate dielectric material that is prone to degradation at high temperature due to decomposition or other structural degradation mechanisms. A replacement gate MOSFET is formed by forming activated source and drain regions and optionally metal semiconductor alloys before deposition of a gate dielectric and a gate electrode. Because the gate dielectric and the gate electrode "replaces" a disposable gate structure by filling a recessed region formed after removal of the disposable gate structure, the gate dielectric material, which is typically a high-k gate dielectric material, follows the contour of the recessed region. Thus, use of a high-k gate dielectric material in a replacement gate scheme results in formation of vertical portions of the high-k gate dielectric material as a sidewall structure laterally surrounding the gate electrode formed therein. The high dielectric constant of material of the sidewall results in a significant parasitic capacitance between the gate electrode and the source and drain regions of a replacement gate MOSFET, adversely impacting the performance of the replacement gate MOSFET.

Further, replacement gate MOSFETs typically employ a work function metal portion in each gate electrode such that the work function metal portion contacts the high-k gate dielectric. The work function metals, however, have a greater resistivity than other conductive materials, such as aluminum, that is deposited on the work function metals and fills a predominant portion of the gate electrode. While a horizontal portion of the work function metal portion contacting a top surface of a high-k gate dielectric is required in order to adjust threshold voltage of the replacement gate MOSFET, vertical portions of the work function metal portion located on sidewalls of a gate electrode and laterally surrounding the other conductive material merely increase the resistance of the gate electrode, which includes a U-shaped work function metal portion and an inner conductor portion containing the other conductive material.

SUMMARY

In a replacement gate scheme, a continuous material layer is deposited on a bottom surface and a sidewall surface in a gate cavity. A vertical portion of the continuous material layer is removed to form a gate component of which a vertical portion does not extend to a top of the gate cavity. The gate component can be employed as a gate dielectric or a work function metal portion to form a gate structure that enhances performance of a replacement gate field effect transistor.

A replacement gate field effect transistor can formed by removing a disposable gate stack and forming a recessed region. In one embodiment, after depositing a high dielectric constant (high-k) gate dielectric, a blocking structure covering a horizontal portion of the high-k gate dielectric is formed within the recessed region, while exposing the sidewall portions of the high-k gate dielectric. The sidewall portions of the high-k gate dielectric are removed, followed by removal of the blocking structure. In another embodiment, after depositing a high-k gate dielectric and a non-conformal work function metal layer within the recessed region, the non-conformal work function metal layer is isotropically etched to provide a work function metal portion contacting a horizontal surface of the high-k gate dielectric, while sidewall portions of the work function metal layer are removed. A conductive metal is deposited on the work function metal portion, which, in conjunction with that work function metal portion, forms a gate electrode.

According to an aspect of the present disclosure, a method of forming a semiconductor structure includes: forming a recessed region laterally surrounded by a dielectric material on a semiconductor substrate; forming a continuous material layer in the recessed region and over the dielectric material; forming a gate component including a horizontal portion and an adjoining lower vertical portion of the continuous material layer by removing an upper vertical portion of the continuous material layer within the recessed region; and forming a field effect transistor including the gate component in a gate stack.

According to another aspect of the present disclosure, a semiconductor structure is provided, which includes: a field effect transistor including a gate stack of a gate dielectric and a gate conductor, wherein the gate dielectric includes a dielectric material having a dielectric constant greater than 8.0 and includes a horizontal portion and a peripheral portion including sidewalls that protrude above a top planar surface of the horizontal portion; and a dielectric gate spacer including a dielectric material having a different composition than the gate dielectric and contacting sidewalls of the gate conductor.

According to even another aspect of the present disclosure, a semiconductor structure is provided, which includes: a field effect transistor containing a gate stack of a gate dielectric and a gate conductor, wherein the gate conductor includes a work function metal portion and a conductive metal portion, wherein sidewalls of the conductive metal portion contact, and are vertically coincident with, sidewalls of the gate dielectric.

According to yet another aspect of the present disclosure, a method of forming a semiconductor structure is provided, which includes: forming a recessed region laterally surrounded by a dielectric gate spacer on a semiconductor substrate; forming a gate dielectric layer on a semiconductor surface in the recessed region; forming a work function metal portion on a horizontal portion of the gate dielectric layer in the recessed region, wherein sidewalls of vertical portions of the gate dielectric layer are exposed over the work function metal portion in the recessed region; and forming a conductive metal portion directly on the work function metal portion.

According to still another aspect of the present disclosure, another method of forming a semiconductor structure is provided, which includes: forming a recessed region laterally surrounded by a dielectric gate spacer on a semiconductor substrate; forming a gate dielectric layer on a semiconductor surface in the recessed region; forming a blocking structure on a horizontal portion of the gate dielectric layer in the recessed region, wherein sidewalls of vertical portions of the gate dielectric layer are exposed over the blocking structure in the recessed region; and removing the vertical portions of the gate dielectric layer, wherein a gate dielectric is formed underneath the blocking structure.

DETAILED DESCRIPTION

Figure 1:
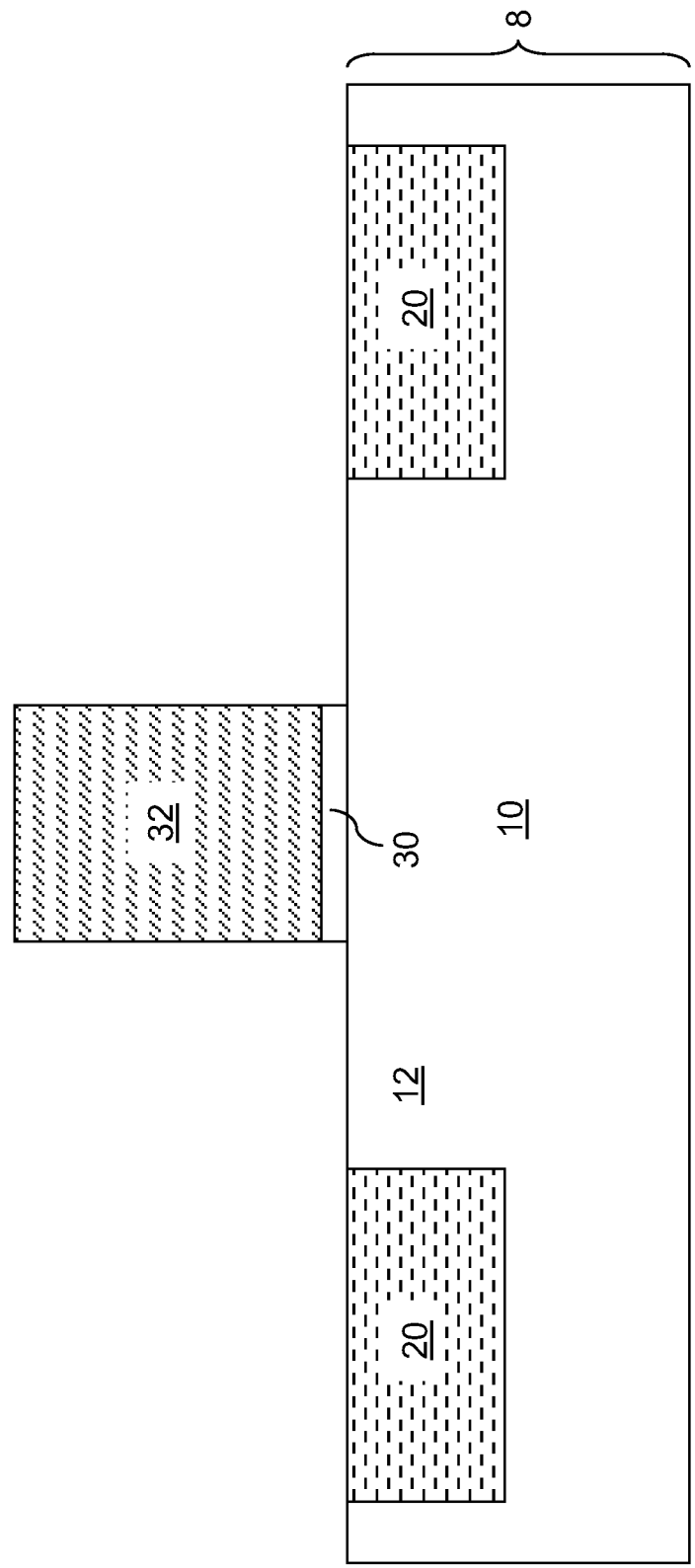
FIG. 1 is a vertical cross-sectional view of a first exemplary semiconductor structure after formation of a disposable gate stack according to a first embodiment of the present disclosure.

As stated above, the present disclosure relates to a metal-oxide-semiconductor field effect transistor (MOSFET) having a high performance replacement gate electrode configured to provide reduced parasitic capacitance and/or low resistance, and methods of manufacturing the same, which are now described in detail with accompanying figures. It is noted that like and corresponding elements mentioned herein and illustrated in the drawings are referred to by like reference numerals.

Referring to FIG. 1, a first exemplary semiconductor structure according to a first embodiment of the present disclosure includes a semiconductor substrate 8. The semiconductor substrate 8 includes a semiconductor layer 10 and isolation structures 20 embedded in the semiconductor layer 10. The isolation structures 20 include a dielectric material such as silicon oxide and/or silicon nitride. For example, the isolation structures 20 can be shallow trench isolation structures known in the art.

The semiconductor layer 10 is composed of a semiconductor material such as silicon, a silicon containing alloy, a germanium containing alloy, a III-V compound semiconductor, or a II-IV semiconductor. Preferably, the entirety of the semiconductor layer 10 is single crystalline. The semiconductor substrate 8 may be a bulk substrate, a semiconductor-on-insulator (SOI) substrate, or a hybrid substrate including a bulk portion and an SOI portion. If the semiconductor substrate 8 is an SOI substrate or a hybrid substrate, the semiconductor substrate 8 includes a buried insulator layer (not shown) or a buried insulator portion (not shown) that is located on a bottom surface of the isolation structures 20, and the semiconductor layer 10 may be vertically confined between the top surfaces and the bottom surfaces of the isolation structures 20. While the present disclosure is described with an SOI substrate, equivalent embodiments employing other types of substrates are also contemplated herein.

A disposable material stack is formed on the surface of the semiconductor substrate 10. The disposable material stack can include a disposable dielectric 30 and a disposable material portion 32. For example, the disposable dielectric 30 can include silicon oxide or another dielectric material that can be etched selective to the semiconductor material of the semiconductor layer 10. The thickness of the disposable dielectric 30 can be from 1 nm to 30 nm, and typically from 1 nm to 5 nm, although lesser and greater thicknesses can also be employed.

The disposable material portion 32 can include a material that can be etched selective to the material of a dielectric gate spacer to be subsequently formed. For example, the disposable material portion 32 can be composed of polysilicon or a silicon-containing semiconductor alloy such as a silicon-germanium alloy. Alternately, the disposable material portion 32 can include a dielectric material or a conductive material that can be etched selective to the material of a dielectric gate spacer to be subsequently formed. The thickness of the disposable material portion 32 can be from 50 nm to 500 nm, and typically from 80 nm to 250 nm, although lesser and greater thicknesses can also be employed.

The disposable material stack can be formed by depositing the materials of the disposable dielectric 30 and the disposable material portion 32 as blanket layers, and subsequently lithographically patterning the blanket layers so that remaining portions of the blanket layer constitute the disposable material stack located on a portion of the semiconductor layer 10 between two isolation structures 20. The sidewalls of the disposable dielectric 30 and the disposable material portion 32 are substantially vertical. Further, sidewalls of the disposable dielectric 30 and the disposable material portion 32 are vertically coincident, i.e., sidewalls of the disposable dielectric 30 coincide with sidewalls of the disposable material portion 32 in a top-down view.

Figure 2:
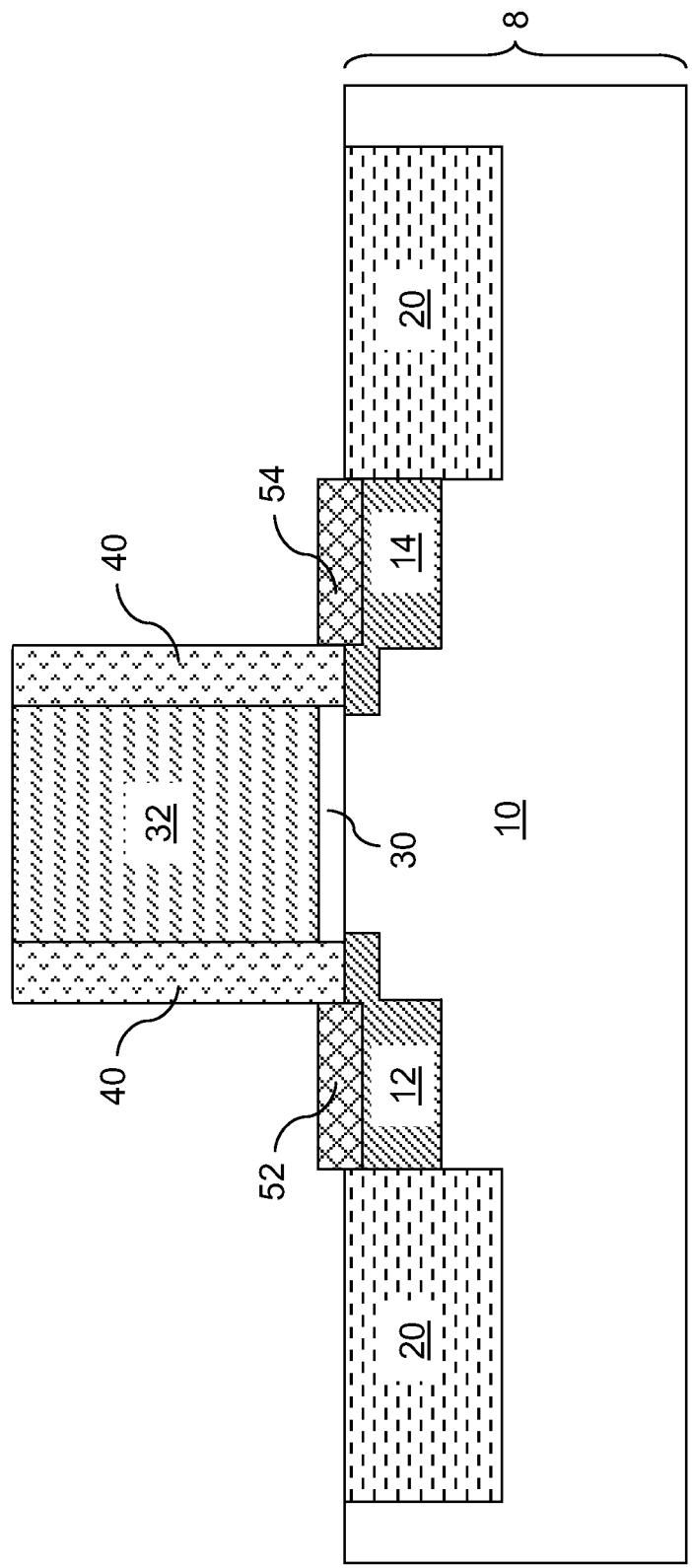
FIG. 2 is a vertical cross-sectional view of the first exemplary semiconductor structure of FIG. 1 after formation of a dielectric gate spacer, source and drain regions, and source-side and drain-side metal semiconductor alloy portions according to the first embodiment of the present disclosure.

Referring to FIG. 2, source and drain extension implantation is performed to form source and drain extension regions, which are laterally protruding portions of a source region 12 and a drain region 14 that contact the disposable dielectric 30. A dielectric gate spacer 40 is formed by depositing, and subsequently anisotropically etching, a conformal dielectric material layer. Horizontal portions of the conformal dielectric material layer are removed during the anisotropic etching, and remaining vertical portions of the conformal dielectric material layer after the anisotropic etching constitutes the dielectric gate spacer 40. The dielectric gate spacer 40 comprises a dielectric material such as silicon oxide, silicon nitride, and silicon oxynitride. The dielectric gate spacer 40 has an average dielectric constant less than 8.0. In one embodiment, an entirety of the dielectric gate spacer has a dielectric constant less than 8.0. It is noted that silicon nitride has a dielectric constant of 7.9 and undoped silicon oxide has a dielectric constant of 3.9.

Deep source and drain implantation is performed to complete formation of the source region 12 and the drain region 14, which include the source and drain extension regions, respectively, at the end of the deep source and drain implantation. The source region 12 and the drain region 14 have a doping of the opposite conductivity type than the remaining portion of the semiconductor layer 10, which functions as a body region of a transistor. A source-side metal semiconductor alloy portion 52 and a drain-side metal semiconductor alloy portion 54 are formed by reacting a metal layer with the exposed portions of the source region 12 and the drain region 14 employing methods known in the art. Unreacted portions of the metal layer are removed after formation of the source-side metal semiconductor alloy portion 52 and the drain-side metal semiconductor alloy portion 54. The source-side metal semiconductor alloy portion 52 is a conductive structure located directly on the source region 12, and the drain-side metal semiconductor alloy portion 54 is a conductive structure located directly on the drain region 14. The source-side metal semiconductor alloy portion 52 and the drain-side metal semiconductor alloy portion 54 can be a metal silicide if the semiconductor material of the source region 12 and the drain region 14 include silicon.

Figure 3:
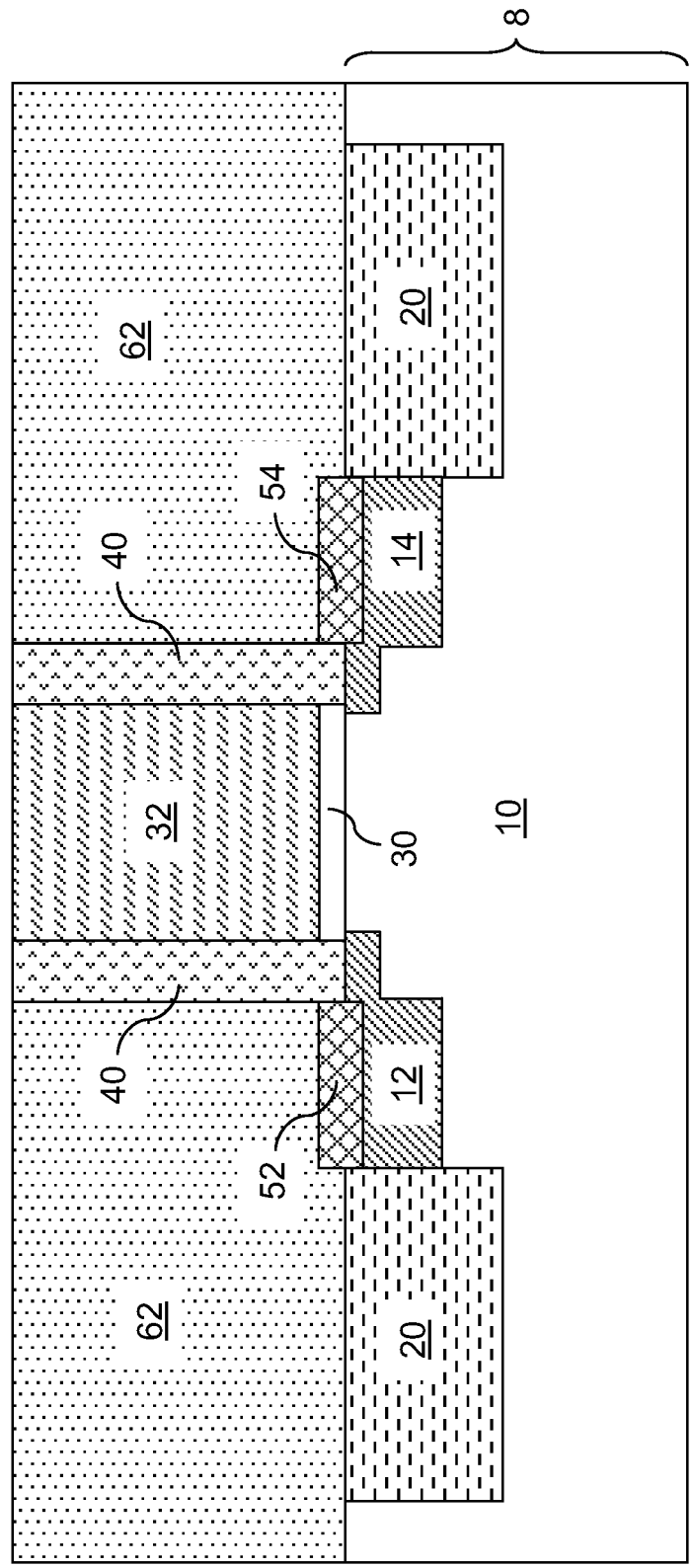
FIG. 3 is a vertical cross-sectional view of the first exemplary semiconductor structure of FIG. 2 after formation and planarization of a dielectric material layer according to the first embodiment of the present disclosure.

Referring to FIG. 3, an optional dielectric liner (not shown) may be conformally deposited over the semiconductor substrate 8, the source-side and drain-side metal semiconductor alloy portions (52, 54), the dielectric gate spacer 40, and the disposable material portion 32. If present, the optional dielectric liner includes a dielectric material such as silicon oxide or silicon nitride. A dielectric material layer 62 is deposited over the optional dielectric liner, if present, or over the semiconductor substrate 8, the source-side and drain-side metal semiconductor alloy portions (52, 54), the dielectric gate spacer 40, and the disposable material portion 32. The dielectric material layer 62 includes a dielectric material such as undoped silicate glass, doped silicate glass, organosilicate glass (OSG), or a porous dielectric material. In one embodiment, the dielectric material layer 62 can include a porous or non-porous low dielectric constant (low-k) material having a dielectric constant less than 2.7. The dielectric material layer 62 is subsequently planarized so that the top surfaces of the disposable material portion 32, the dielectric gate spacer 40, and the dielectric material layer 62 are coplanar, i.e., located within the same horizontal plane. A topmost portion of the dielectric gate spacer 40 can be removed during the planarization process.

Because the outer sidewalls of the dielectric gate spacer 40 are vertical, the optional dielectric liner 40, if present, includes a vertical portion that contiguously extends to the top surface of the dielectric material layer 62. The dielectric gate spacer 40 has inner vertical sidewalls and outer vertical sidewalls, each of which extends from the top surface of the semiconductor substrate 8 to the top surface of the dielectric material layer 62.

Figure 4:
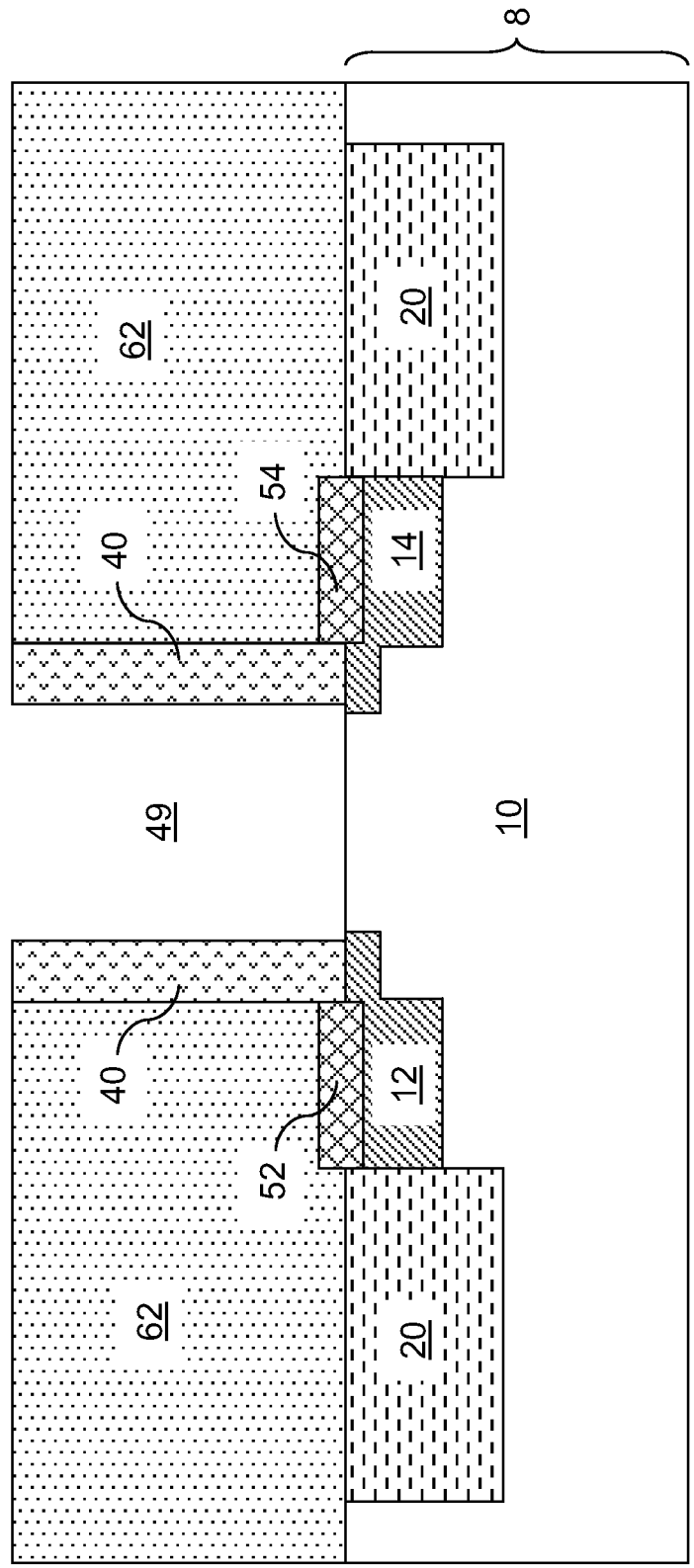
FIG. 4 is a vertical cross-sectional view of the first exemplary semiconductor structure of FIG. 3 after removal of the disposable gate stack according to the first embodiment of the present disclosure.

Referring to FIG. 4, the disposable gate stack including the disposable material portion 32 and the disposable dielectric 30 are removed selective to the dielectric gate spacer 40 and the dielectric material layer 62. The removal of the disposable gate stack (32, 30) can be effected, for example, by a first isotropic or anisotropic etch that removes the material of the disposable material portion 32 while not removing the materials of the dielectric gate spacer 40 and the dielectric material layer 62, followed by a second isotropic or anisotropic etch that removes the disposable dielectric 30 while not removing, or only marginally removing, the materials of the dielectric gate spacer 40 and the dielectric material layer 62. A recessed region, which is herein referred to as a gate cavity 49, is formed after removal of the disposable material stack (32, 30). A portion of the top surface of the semiconductor substrate 8 is exposed within the gate cavity 49. The gate cavity 49 is laterally confined by the inner sidewalls of the dielectric gate spacer 40.

Figure 5:
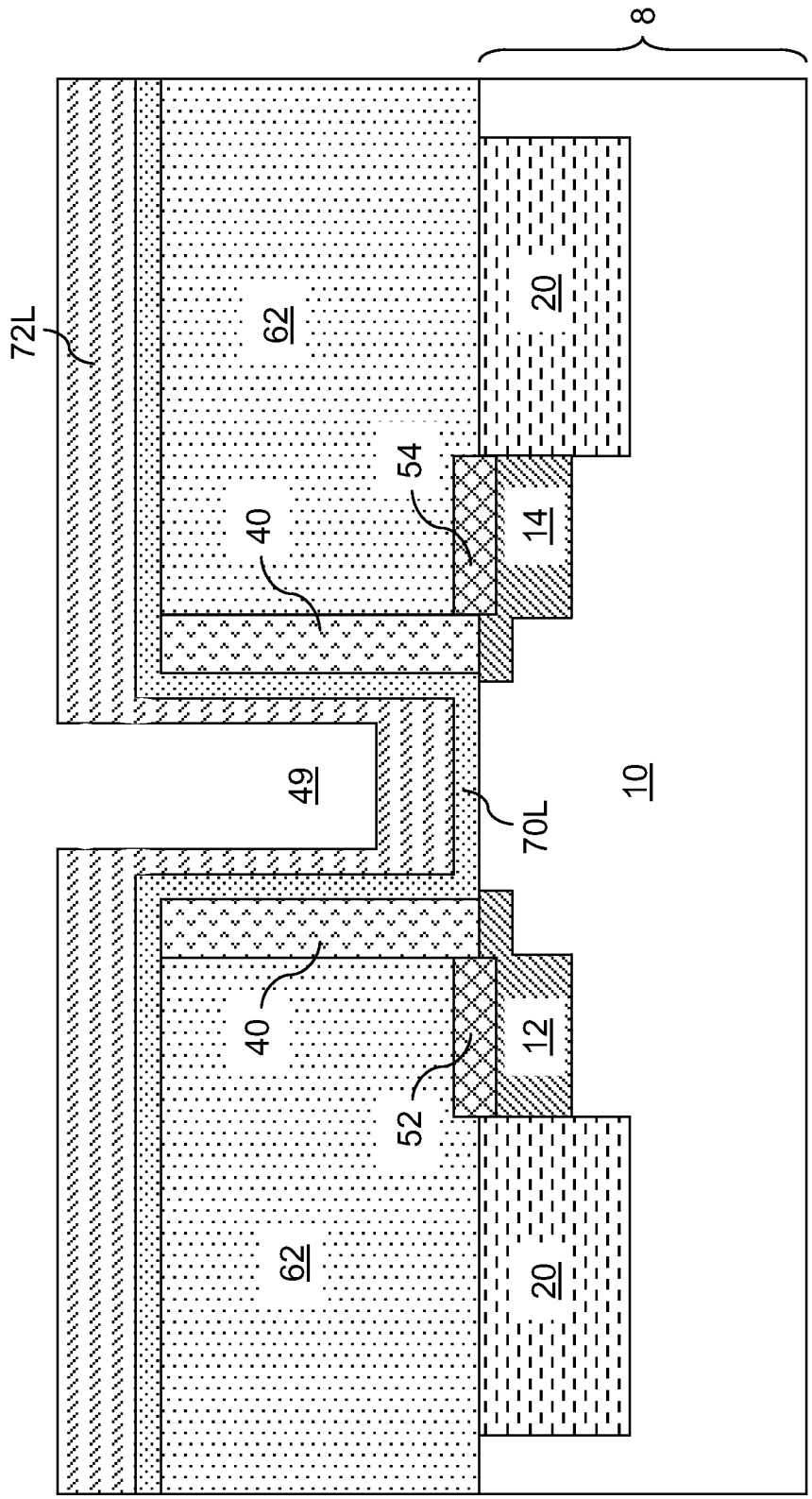
FIG. 5 is a vertical cross-sectional view of the first exemplary semiconductor structure of FIG. 4 after formation of a high dielectric constant (high-k) gate dielectric layer and a non-conformal blocking material layer according to the first embodiment of the present disclosure.

Referring to FIG. 5, a gate dielectric layer 70L and a blocking material layer 72L are sequentially deposited in the gate cavity 49 and over the dielectric material layer 62 without completely filling the gate cavity 49. The gate dielectric layer 70L is a continuous material layer that continuously covers, without a hole therein, the entirety of exposed surfaces of the dielectric material layer 62, the dielectric gate spacer 40, and the semiconductor layer 10. The gate dielectric layer 70L is formed by a conformal or non-conformal deposition of a dielectric material. The gate dielectric layer 70L includes a U-shaped gate dielectric portion that contiguously extends from the top surface of the semiconductor substrate 8 to the top surface of the dielectric material layer 62. For example, the gate dielectric can be composed of a high dielectric constant (high-k) dielectric material including a dielectric metal oxide and having a dielectric constant greater than 8.0. The high-k dielectric material may be formed by methods well known in the art.

The blocking material layer 72L is a non-conformal layer having a greater thickness in horizontal portion than in vertical portions. The blocking material layer 72L is deposited employing a deposition process that enables a non-conformal deposition such as physical vapor deposition (PVD), non-conformal chemical vapor deposition operating in a mass-transport limited deposition region, or vacuum evaporation. A collimating device can be employed to enhance directionality of sputtered particles if physical vapor deposition is employed. If vacuum evaporation is employed, an effusion cell or an electron beam source can be employed as the source of beam containing the material to be deposited. The thickness of the blocking material layer 72L on the sidewalls of the gate dielectric layer 70L can be from 0 nm to 10 nm, and the thickness of the blocking material layer on horizontal portions of the gate dielectric layer 70L can be from 5 nm to 50 nm. The ratio of the thickness of the blocking material layer 72L on the sidewalls of the gate dielectric layer 70L to the thickness of the blocking material layer 72L on the horizontal portions of the gate dielectric layer 70L can be from 0 to 0.8, and preferably from 0 to 0.5. If this ratio is 0, which occurs if a highly directional deposition method such as vacuum evaporation with an angular beam spread less than about 2 degree is employed, the blocking material layer 72L can be absent (i.e., less than one atomic layer thick) on the sidewalls of the gate dielectric layer 70L, and an isotropic etch of the blocking material layer 72L, described below, may be omitted.

The material of the blocking material layer 72L is selected so that a first etch process to be subsequently employed can remove the material of the gate dielectric layer 70L selective to the material of the blocking material layer 72L, and a second etch process to be subsequently employed can remove the material of the blocking material layer 72L selective to the material of the gate dielectric layer 70L. In other words, the material of the blocking material layer 72L and the material of the gate dielectric layer 70L are selected to be complementarily etchable with selectivity to each other.

Non-limiting examples of the material that can be employed for the blocking material layer 72L include amorphous or polycrystalline silicon, silicon-germanium alloys, silicon-carbon alloys, and silicon-germanium-carbon alloys. Materials such as amorphous or polycrystalline silicon, silicon-germanium alloys, silicon-carbon alloys, and silicon-germanium-carbon alloys can be deposited by physical vapor deposition, non-conformal chemical vapor deposition operating in a mass-transport limited deposition region, or vacuum evaporation, can function as an effective etch mask for etching most dielectric metal oxides with an etchant such as dilute hydrofluoric acid optionally including ozone, and can be removed selective to most dielectric metal oxides in a hot or warm solution including ammonia. Any other material can be employed for the blocking material layer provided that a non-conformal deposition is possible and the material of the blocking material layer 72L and the material of the gate dielectric layer 70L can be complementarily etchable with selectivity to each other.

Figure 6:
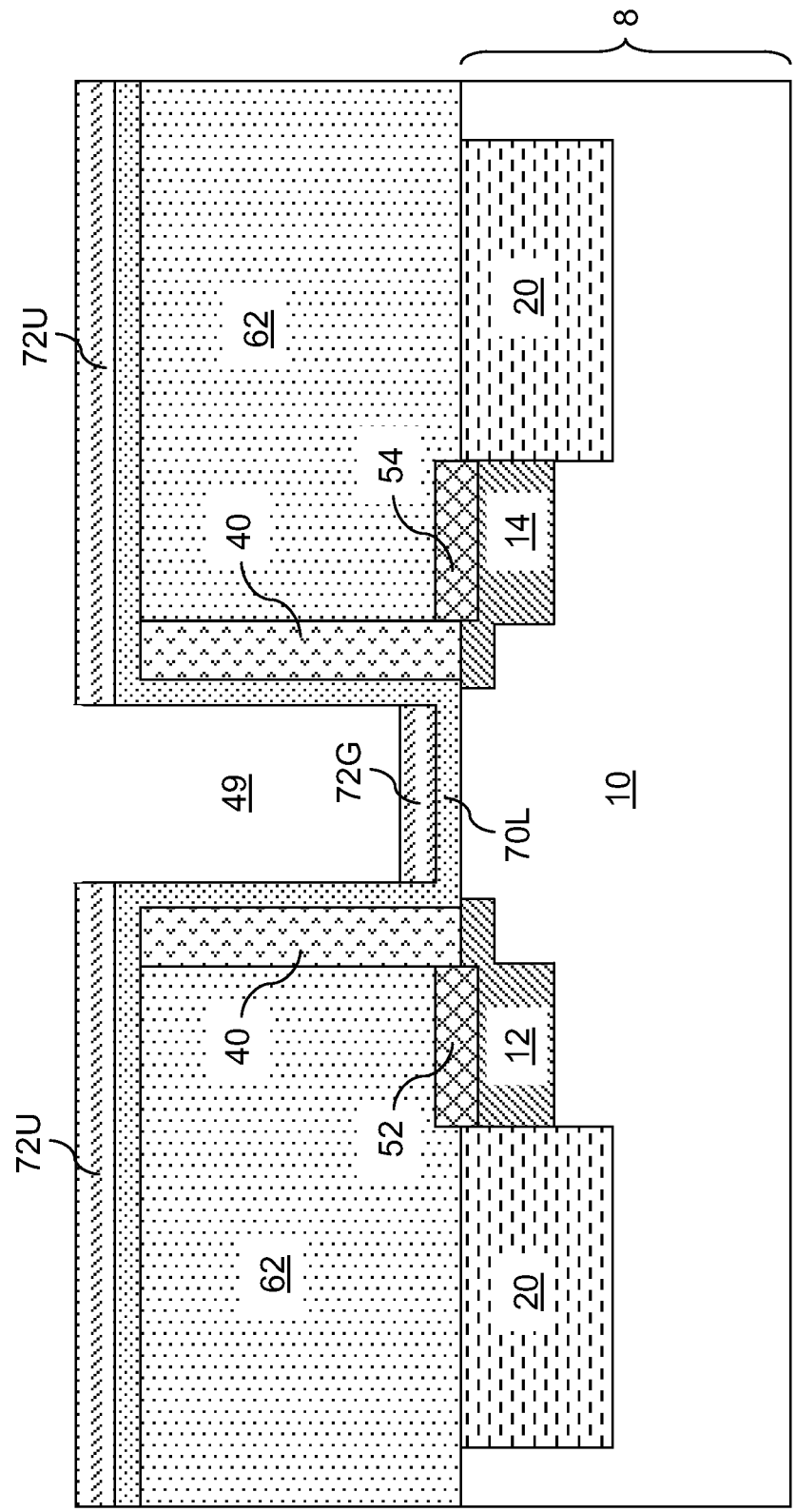
FIG. 6 is a vertical cross-sectional view of the first exemplary semiconductor structure of FIG. 5 after isotropic etching of the non-conformal blocking material layer to form a gate-side blocking structure according to the first embodiment of the present disclosure.

Referring to FIG. 6, the blocking material layer 72L is isotropically etched to remove all vertical portions of the blocking material layer 72L on the sidewalls of the gate dielectric layer 70L and to expose inner sidewalls of the gate dielectric layer 70L. The isotropic etching can be performed employing a wet etch or an isotropic dry etch such as downstream plasma etch or chemical dry etch. The chemistry of the isotropic etching does not need to be selective to the material of the gate dielectric layer 70L. In other words, it is permissible to overetch into the sidewalls of the gate dielectric layer 70L.

A remaining portion of the blocking material layer 72L at the bottom of the gate cavity 49 forms a blocking structure, which is herein referred to as a gate-side blocking structure 72G. The gate-side blocking structure 72G is a blocking structure that overlies the horizontal portion of the gate dielectric layer 70L. The gate-side blocking structure 72G is formed on a horizontal portion of the gate dielectric layer 70L in the recessed region, i.e., in the gate cavity 49. Another remaining portion of the blocking material layer 72L above the topmost surface of the gate dielectric layer 70L forms another blocking structure, which is herein referred to as an upper blocking structure 72U. After the isotropic etch, sidewalls of vertical portions of the gate dielectric layer 70L are exposed over the gate-side blocking structure 72 in the recessed region, i.e., the gate cavity 49. The upper blocking structure 72U is a layer of the blocking material located over the topmost surface of the gate dielectric layer 70L and including at least one hole, of which the area coincides with the area of the gate cavity 49.

Figure 7:
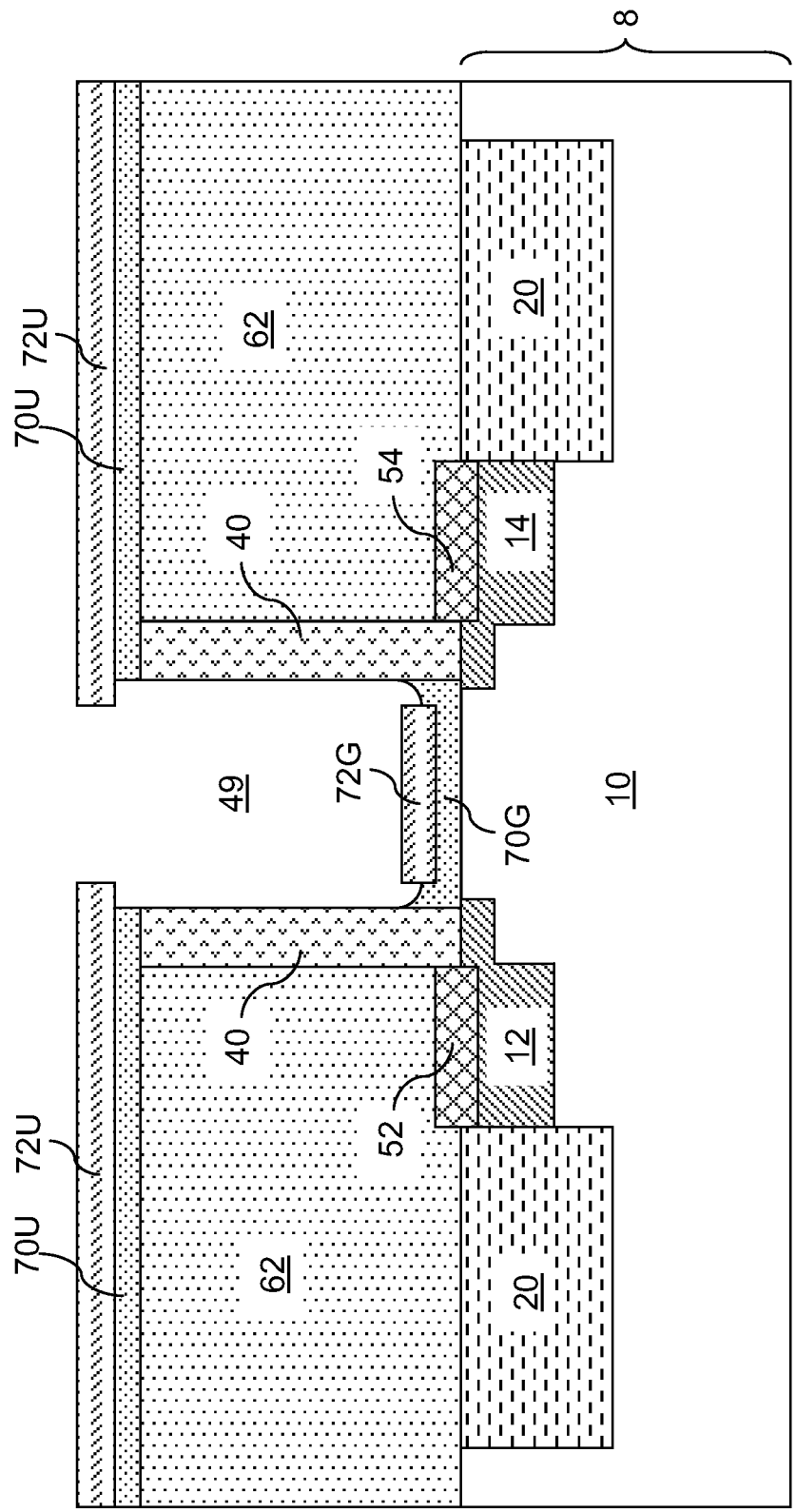
FIG. 7 is a vertical cross-sectional view of the first exemplary semiconductor structure of FIG. 6 after removal of sidewall portions of the high-k gate dielectric layer according to the first embodiment of the present disclosure.

Referring to FIG. 7, an etch process, which is herein referred to as a first etch process, is performed to remove the material of the gate dielectric layer 70L selective to the material of the gate-side blocking structure 72G. The chemistry of the first etch process depends on the material of the gate dielectric layer 70L and the material of the blocking material layer 72L. As discussed above, if the gate dielectric layer 70L includes a dielectric metal oxide and the gate-side blocking structure 72G includes a material such as amorphous or polycrystalline silicon, silicon-germanium alloys, silicon-carbon alloys, and silicon-germanium-carbon alloys, dilute hydrofluoric acid optionally including ozone can be employed to remove the exposed portions of the gate dielectric layer 70L. The first etch process is typically an isotropic etch process, but needs not be completely isotropic as long as some isotropic etch component is present and the gate-side blocking structure 72G is not entirely consumed during the first etch process. The first etch process may be omitted if the blocking material layer 72L is not present on the sidewalls of the gate dielectric layer 70L, which is the case if a highly directional deposition method such as vacuum evaporation is employed to deposit the blocking material layer 72L.

After the removal of the vertical portions of the gate dielectric layer 70L, a remaining portion of the gate dielectric layer 70L underneath the gate-side blocking structure 72G forms a gate dielectric 70G, which contacts a top surface of the semiconductor layer 10, bottommost portions of the dielectric gate spacer 40, and the bottom surface of the gate-side blocking structure 72G. The gate dielectric 70G is a gate component that is incorporated into a gate stack of a field effect transistor to be subsequently formed. A peripheral portion of the top surface of the gate dielectric 70G laterally surrounds the gate-side blocking structure 72G, and has a concave surface throughout, which is caused by the geometry of the gate dielectric layer 70L relative to the gate-side blocking structure 72G. A remaining portion of the gate dielectric layer 70L above the dielectric material layer 62L forms an upper dielectric material layer 70U, which has the same composition and thickness as the gate dielectric 70G at this step.

Figure 8:
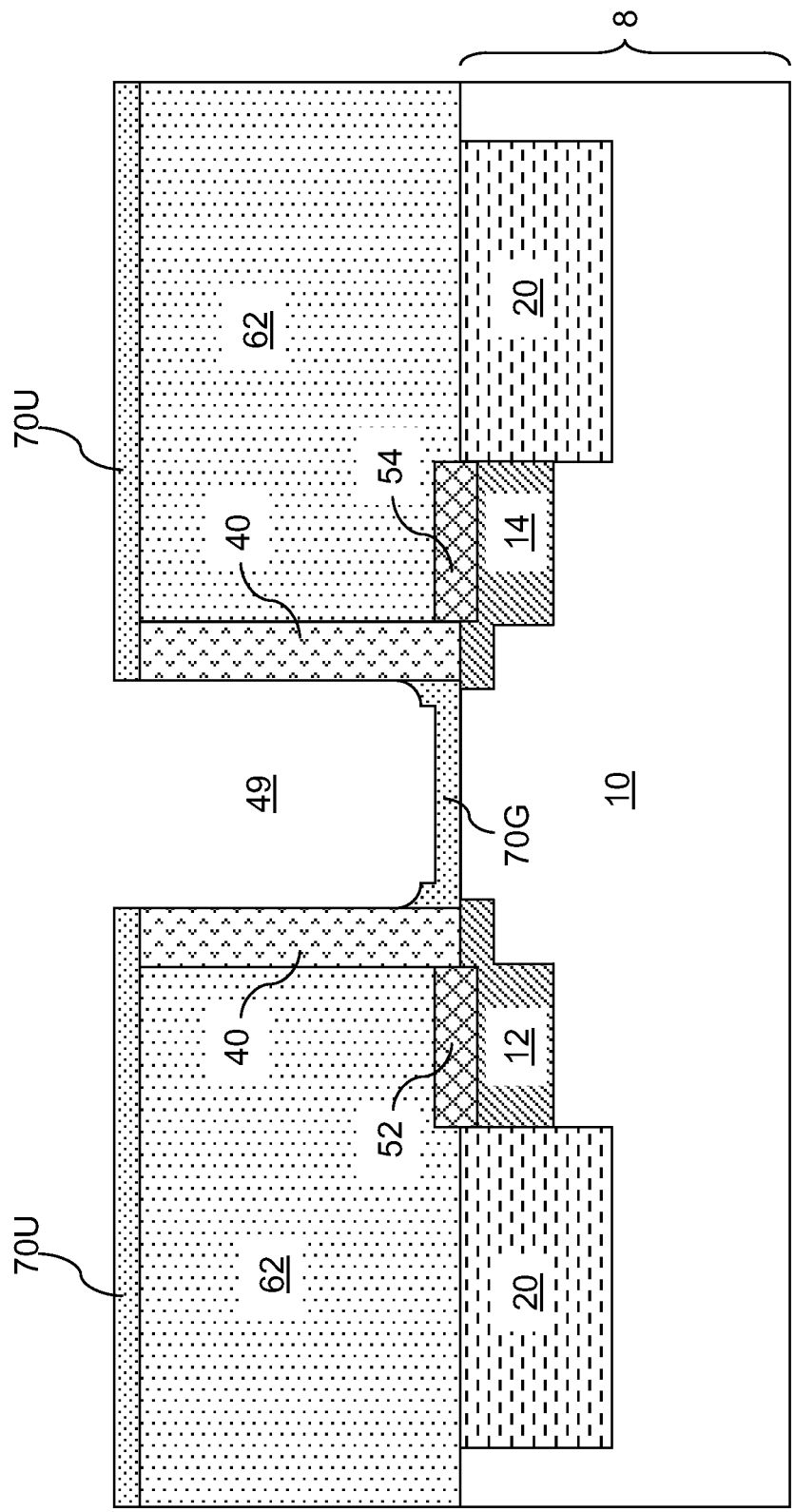
FIG. 8 is a vertical cross-sectional view of the first exemplary semiconductor structure of FIG. 7 after removal of blocking structures according to the first embodiment of the present disclosure.

Referring to FIG. 8, the gate-side blocking structure 72G and the upper blocking structure 72U are removed selective to the gate dielectric 70G by a second etch process. As discussed above, if the gate dielectric layer 70L includes a dielectric metal oxide and the gate-side blocking structure 72G includes a material such as amorphous or polycrystalline silicon, silicon-germanium alloys, silicon-carbon alloys, and silicon-germanium-carbon alloys, a hot or warm solution including ammonia can be employed to remove the gate-side blocking structure 72G and the upper blocking structure 72U selectively to the gate dielectric 70G.

Figure 9:
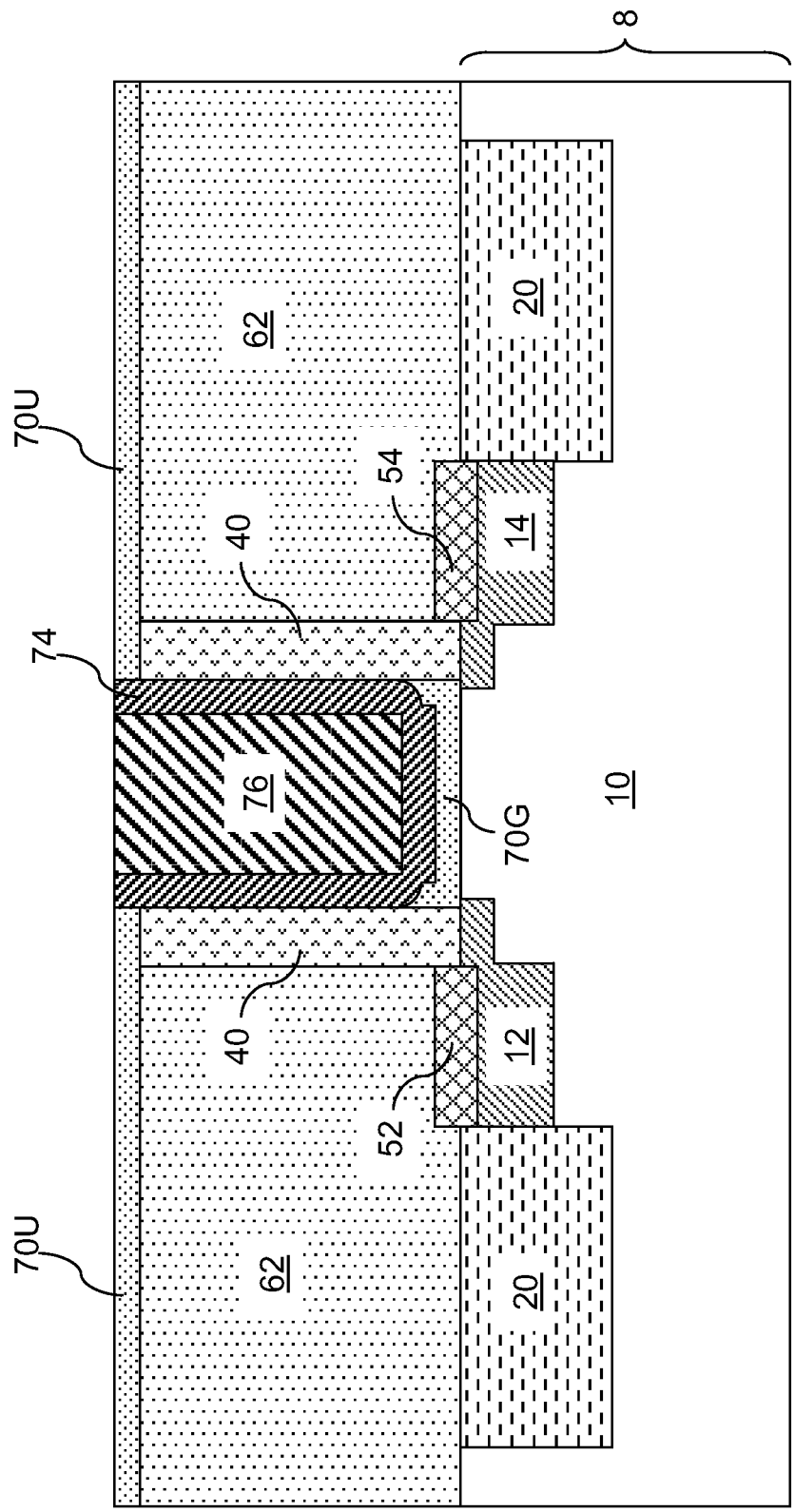
FIG. 9 is a vertical cross-sectional view of the first exemplary semiconductor structure of FIG. 8 after formation of a gate electrode according to the first embodiment of the present disclosure.

Referring to FIG. 9, a gate electrode is formed by depositing at least one conductive material in the gate cavity 49 to fill the gate cavity, and by removing the access portions of the at least one conductive material over the upper dielectric material layer 70U. In one embodiment, the upper dielectric material layer 70U can be employed as a stopping layer during the planarization. In another embodiment, a portion or all of the upper dielectric material layer 70U may be removed during the planarization. Thus, while an embodiment in which the upper dielectric material layer 70U is present is illustrated herein, embodiments in which the upper dielectric material layer 70U is removed can also be practiced. As such, the upper dielectric material layer 70U is an optional structure, and if the upper dielectric material layer 70U is absent, the top surface of the gate electrode is coplanar with the top surface of the dielectric material layer 62.

The gate electrode may include a work function metal portion 74 and a conductive metal portion 76. The material of the work function metal portion 74 is first deposited as a work function metal layer (not shown) directly on the top surfaces of the gate dielectric 70G, the inner sidewalls of the dielectric gate spacer 40, and the exposed surfaces of the upper dielectric material layer 70U. The material of the conductive metal portion 76L is then deposited as a conductive metal layer (not shown) directly on the exposed surfaces of the work function metal layer to fill the gate cavity 49 (See FIG. 8).

The material of the work function metal portion 74 can be selected depending on the type of field effect transistor to be formed and the desired work function of the replacement gate in the field effect transistor. The material of the conductive metal portion 76 can be the same as, or can be different from, the material of the work function metal portion 74. Typically, the material of the conductive metal portion 76 is different from the material of the work function metal portion 74, and is selected from metallic material having a greater conductivity than the conductivity of the work function metal portion 74. The material of the conductive metal portion 76 can be deposited, for example, by chemical vapor deposition (CVD), physical vapor deposition (PVD), atomic layer deposition (ALD), etc. The planarization process removes excess portions of the work function metal layer and the conductive metal layer above the topmost surface of the remaining dielectric material layers, which can be a stack of the dielectric material layer 62 and the upper dielectric material layer 70U or the dielectric material layer 62 alone depending on whether the upper dielectric material layer 70U is completely removed during the planarization process.

After the planarization process, at least one dielectric material layer (62, 70U) laterally contacts the dielectric gate spacer 40. The at least one dielectric material layer (62, 70U) has a top surface that is coplanar with a top surface of the gate electrode (74, 76). A lower portion of inner sidewalls of the dielectric gate spacer 40 laterally contacts the gate dielectric 70G, and an upper portion of the inner sidewalls of the dielectric gate spacer 40 laterally contacts the gate electrode (74, 76). Specifically, the upper portion of the inner sidewalls of the dielectric gate spacer 40 laterally contacts the work function metal portion 74. The work function metal portion contacts the gate dielectric 70G, and the conductive metal portion 76 contacts a top surface of the work function metal portion 74. The top surface of the gate dielectric 70G includes a recessed central portion that is planar and parallel to the bottom surface of the gate dielectric 70G and a concave peripheral portion that contacts a convex bottom surface portion of the work function metal portion 74.

The gate dielectric 70G includes a horizontal portion and a peripheral portion. The peripheral portion has outer sidewalls that adjoin the entirety of the periphery of the horizontal portion. Further, the gate dielectric 70G includes inner sidewalls that contact lower portions of the sidewalls of the work function metal portion 74. The inner sidewalls and the outer sidewalls of the gate dielectric 70G protrude above a top planar surface of the horizontal portion of the gate dielectric 70G that is parallel to a bottom planar surface of the horizontal portion of the gate dielectric 70G. The entirety of the gate dielectric 70G is of unitary construction and may have a same composition throughout. The topmost portion of the peripheral portion of the gate dielectric 70G can include a contiguous concave surface that faces inward, i.e., toward the work function metal portion 74, and upward. The entirety of the contiguous concave surface of the topmost portion of the peripheral portion of the gate dielectric 70G can contact the work function metal portion 74.

Figure 10:
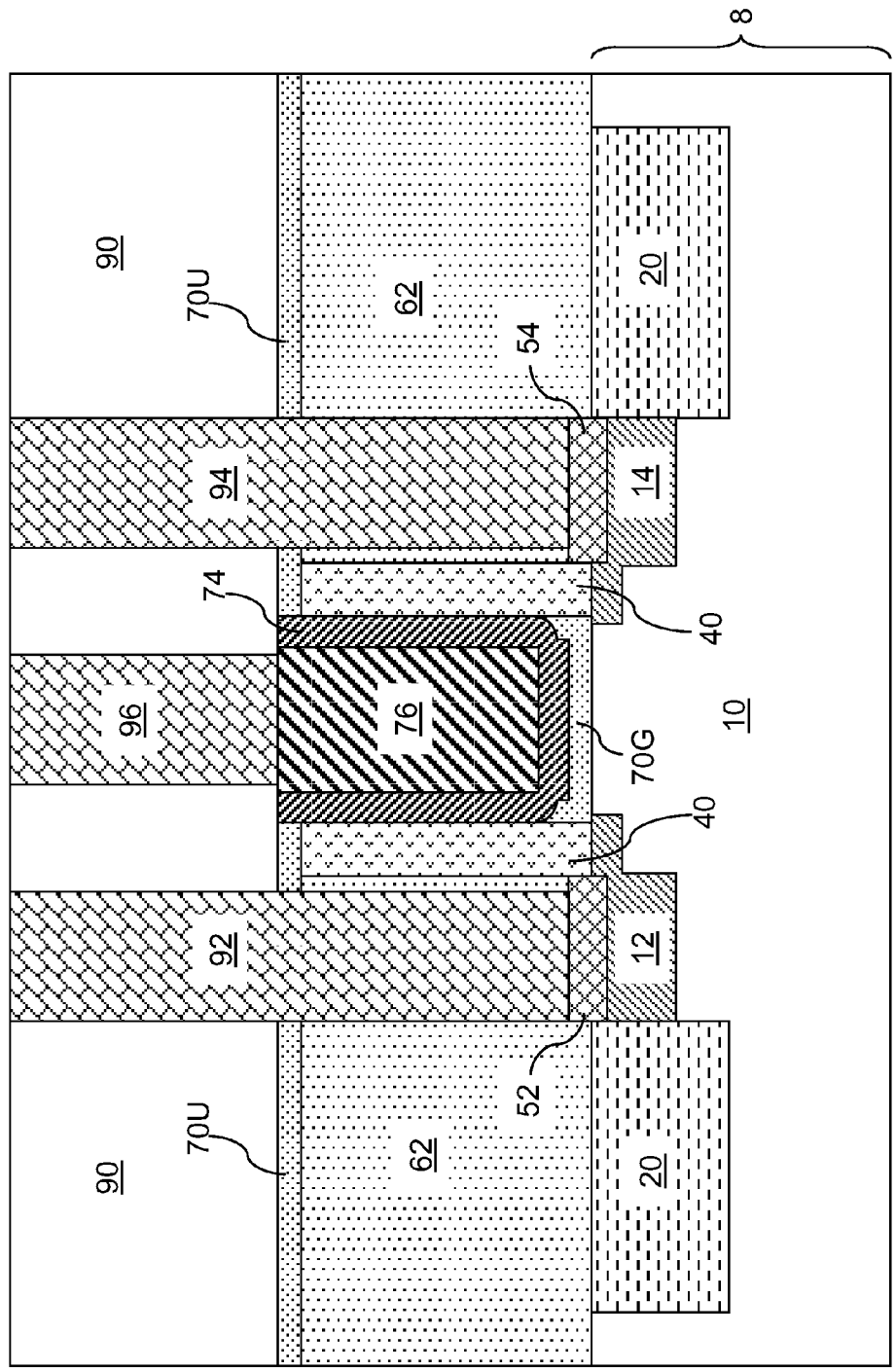
FIG. 10 is a vertical cross-sectional view of the first exemplary semiconductor structure of FIG. 10 after formation of conductive via structures according to the first embodiment of the present disclosure.

Referring to FIG. 10, at least one overlying dielectric material layer 90 is deposited on the at least one dielectric material layer (62, 70U). The at least one overlying dielectric material layer 90 may be a single homogeneous dielectric material layer or a stack of multiple dielectric material layers having different compositions. Exemplary materials that may be employed for the at least one overlying dielectric material layer 90 include silicon nitride, silicon oxide, organosilicate glass (OSG), and other dielectric materials for interconnect levels as known in the art. Contact via structures are formed in the at least one overlying dielectric material layer 90 and/or the at least one dielectric material layer (62, 70U) be forming via cavities employing lithographic patterning and an etch and by filling the via cavities with a conductive material. The contact via structures may include a source-side contact via structure 92, a drain-side contact via structure 94, and a gate-side contact via structure 96.

Figure 11:
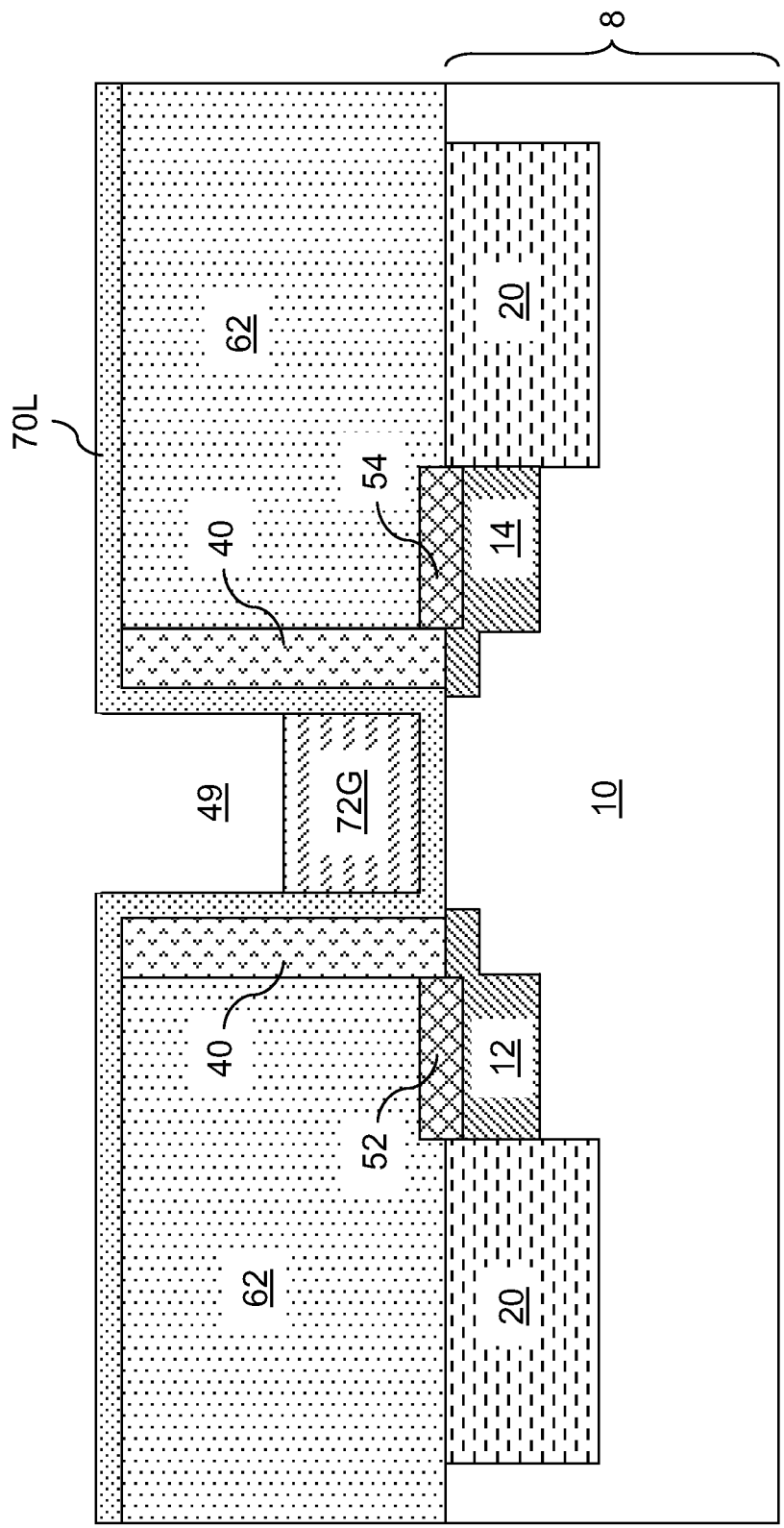
FIG. 11 is a vertical cross-sectional view of a second exemplary semiconductor structure after formation of a gate-side blocking structure according to a second embodiment of the present disclosure.

Referring to FIG. 11, a second exemplary semiconductor structure according to a second embodiment of the present disclosure is derived from the first exemplary semiconductor structure of FIG. 4 by depositing a gate dielectric layer 70L and forming a gate-side blocking structure 72G. The gate dielectric layer 70L of the second embodiment can have the same composition and thickness as the gate dielectric layer 70L of the first embodiment, and can be formed by employing the same processing steps as in the first embodiment.

The gate-side blocking structure 72G of the second embodiment can have the same composition as the gate-side blocking structure 72G of the first embodiment, but the gate-side blocking structure 72G of the second embodiment may be selected from additional materials that may be deposited employing a non-directional deposition method or even a conformal deposition method such as low pressure chemical vapor deposition (LPCVD).

The gate cavity 49 is filled with a blocking material layer (not shown) including a material that can be removed selective to the material of the gate dielectric layer 70L in an etch process. The blocking material layer is then recessed to a level below a top surface of the dielectric gate spacer 40. The remaining portion of the blocking material layer within the gate cavity 49, which is a recessed region, forms the gate-side blocking structure 72G. The gate-side blocking structure 72G is a blocking structure that overlies a bottom horizontal portion of the gate dielectric layer 70L at the gate cavity 49.

In the second embodiment, the gate-side blocking structure 72G can be formed by filling the gate cavity 49 with any material that can be removed selective to the material of the gate dielectric layer 70L. The material of the gate-side blocking structure 72G does not need to be resistant to an etch process that is employed to remove exposed portions of the gate dielectric layer 70L in a later processing step described below, provided that the some portion of the gate-side blocking structure 72G remains at the end of that etch process.

Figure 12:
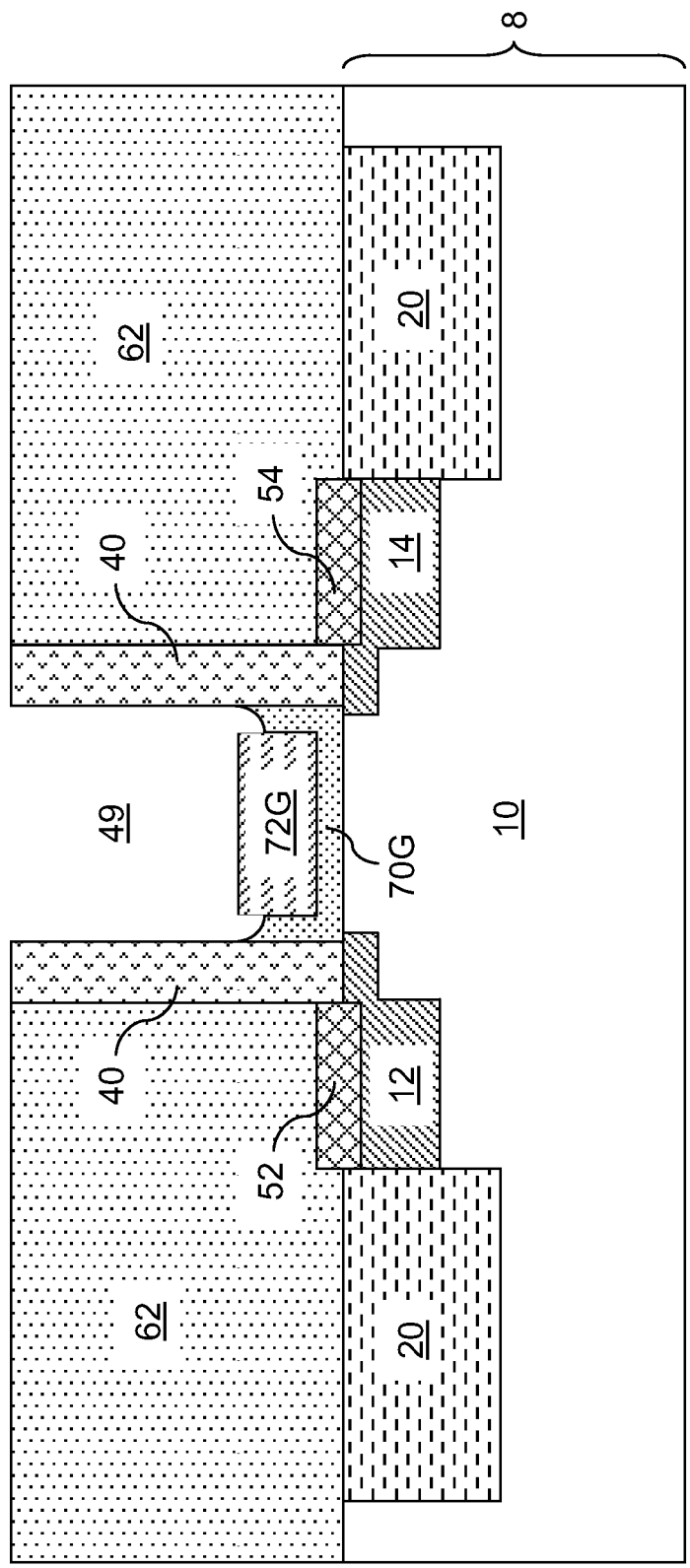
FIG. 12 is a vertical cross-sectional view of the second exemplary semiconductor structure of FIG. 11 after removal of sidewall portions of the high-k gate dielectric layer according to the second embodiment of the present disclosure.

Referring to FIG. 12, an etch process is performed to remove the exposed portions of the dielectric material layer 70L. The etch process can be selective to the material of the gate-side blocking structure 72G, but need not be selective to the material of the gate-side blocking structure 72G provided that at least a portion of the gate-side blocking structure 72G remains after the etch process. The remaining portion of the gate dielectric layer 70G forms a gate dielectric 70G, which has a U-shape and includes a horizontal portion contacting a top surface of the semiconductor layer 10 and a vertical peripheral portion that contacts a lower portion of the inner sidewalls of the dielectric gate spacer 40. The top surface of the vertical peripheral portion of the gate dielectric 70G can have a concave curvature due to the blockage of etching by the gate-side blocking structure 72G. The thickness of the gate-side blocking structure 72G may, or may not, be reduced during the etch process depending on the selectivity of the etch process to the material of the gate-side blocking structure 72G.

Figure 13:
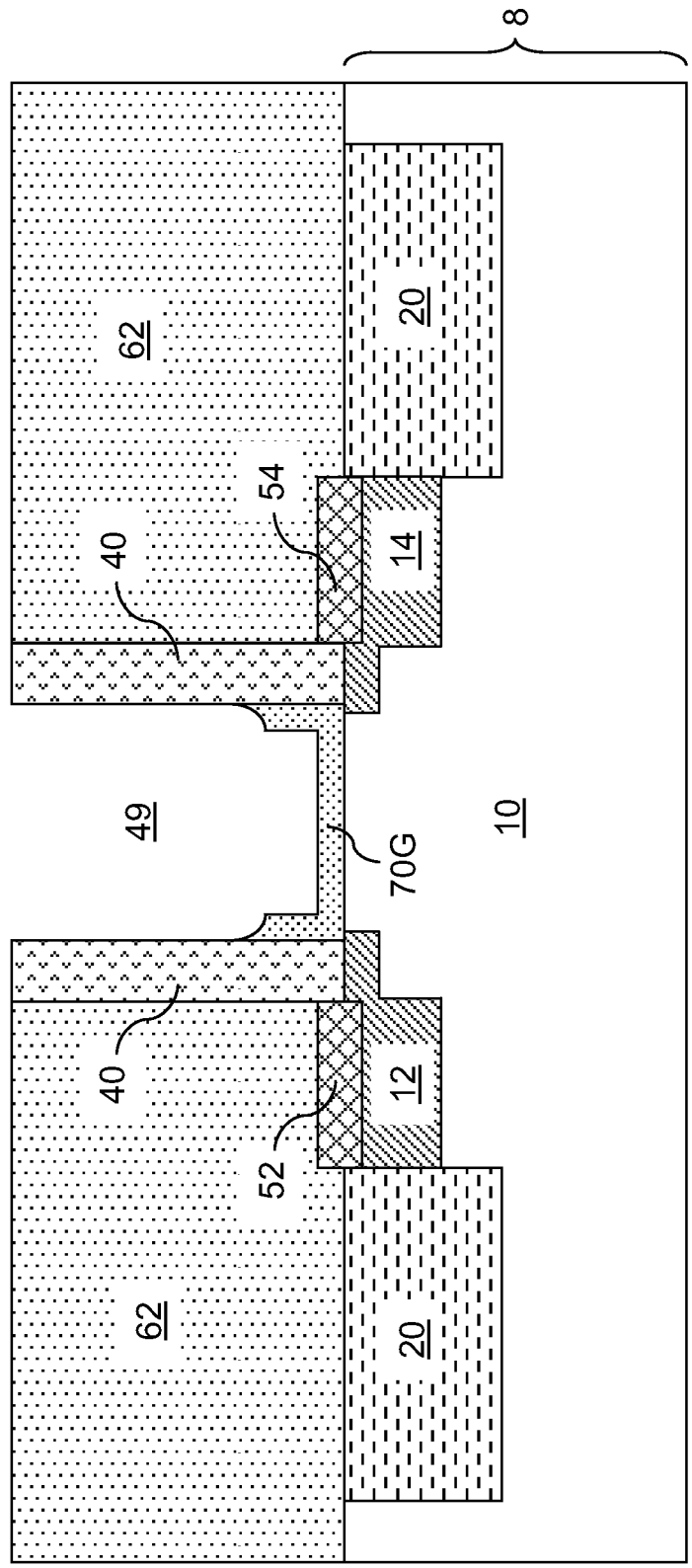
FIG. 13 is a vertical cross-sectional view of the second exemplary semiconductor structure of FIG. 12 after removal of the gate-side blocking structure according to the second embodiment of the present disclosure.

Referring to FIG. 13, the same processing steps as the processing steps of FIG. 8 according to the first embodiment can be employed to remove the gate-side blocking structure 72G selective to the gate dielectric 70G.

Figure 14:
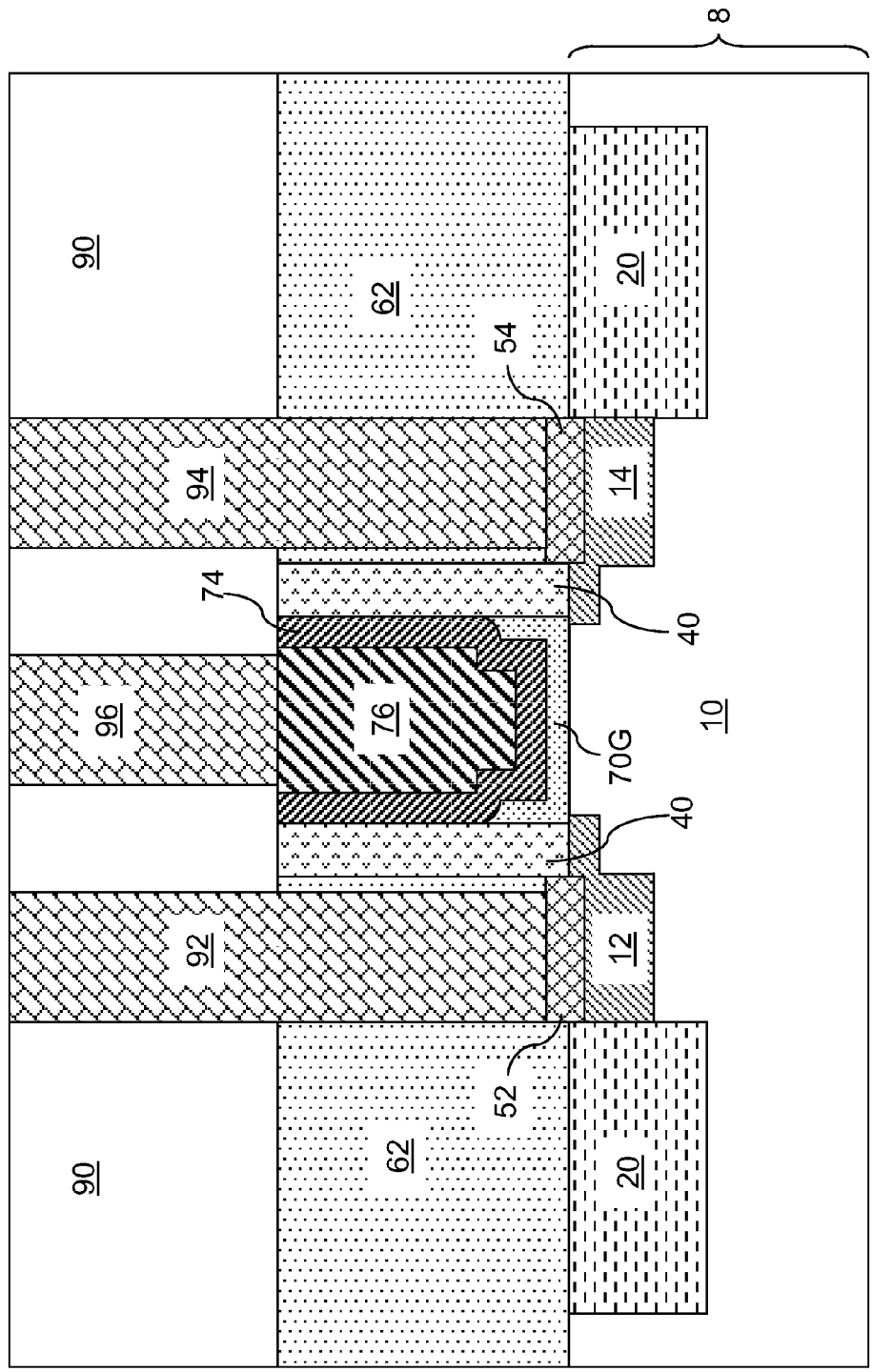
FIG. 14 is a vertical cross-sectional view of the second exemplary semiconductor structure of FIG. 13 after formation of conductive via structures according to the second embodiment of the present disclosure.

Referring to FIG. 14, the same processing steps as the processing steps of FIGS. 9 and 10 according to the first embodiment can be employed to form a gate electrode (704, 76), at least one overlying dielectric material layer 90, and various conductive via structures (92, 94, 96).

As in the first embodiment, the gate dielectric 70G includes a horizontal portion and a peripheral portion. The peripheral portion has outer sidewalls that adjoin the entirety of the periphery of the horizontal portion. Further, the gate dielectric 70G includes inner sidewalls that contact lower portions of the sidewalls of the work function metal portion 74. The inner sidewalls and the outer sidewalls of the gate dielectric 70G protrude above a top planar surface of the horizontal portion of the gate dielectric 70G that is parallel to a bottom planar surface of the horizontal portion of the gate dielectric 70G. The entirety of the gate dielectric 70G is of unitary construction and may have a same composition throughout. The topmost portion of the peripheral portion of the gate dielectric 70G can include a contiguous concave surface that faces inward, i.e., toward the work function metal portion 74, and upward. The entirety of the contiguous concave surface of the topmost portion of the peripheral portion of the gate dielectric 70G can contact the work function metal portion 74.

Figure 15:
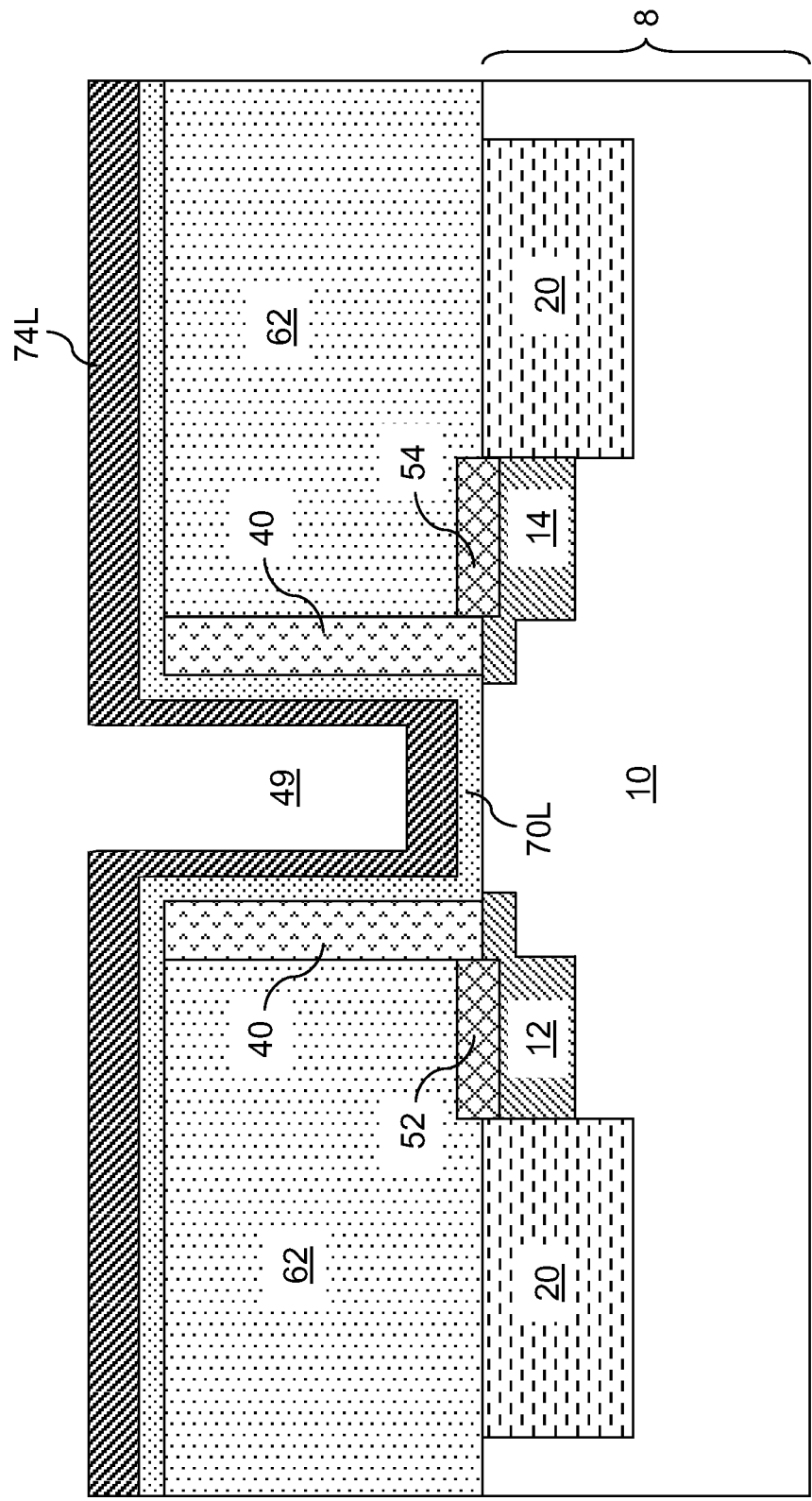
FIG. 15 is a vertical cross-sectional view of a third exemplary semiconductor structure after formation of a non-conformal work function metal layer according to a third embodiment of the present disclosure.

Referring to FIG. 15, a third exemplary semiconductor structure according to a third embodiment of the present disclosure is derived from the first exemplary semiconductor structure of FIG. 4 by depositing a gate dielectric layer 70L and forming a gate-side blocking structure 72G. The gate dielectric layer 70L of the second embodiment can have the same composition and thickness as the gate dielectric layer 70L of the first embodiment, and can be formed by employing the same processing steps as in the first embodiment.

A non-conformal work function metal layer 74L is deposited on the inner sidewalls and top surfaces of the gate dielectric layer 70L employing a non-conformal deposition process. The non-conformal work function metal layer 74L is a continuous material layer that continuously covers the entirety of the exposed surfaces of the gate dielectric layer 70L. The non-conformal deposition process can be physical vapor deposition, non-conformal chemical vapor deposition operating in a mass-transport limited deposition region, or vacuum evaporation. The material of the non-conformal work function metal layer 74L can be the same as the composition of the work function metal portion 74 in the first and second embodiments, and selected for optimal performance of a field effect transistor including the source region 12 and the drain region 14.

The thickness of the non-conformal work function metal layer 74L on the sidewalls of the gate dielectric layer 70L can be from 0 nm to 30 nm, and typically from 0 nm to 15 nm, and the thickness of the blocking material layer on horizontal portions of the gate dielectric layer 70L can be from 5 nm to 100 nm, and typically from 15 nm to 50 nm, although the horizontal portions of the gate dielectric layer 70L can also have lesser or greater thicknesses. The ratio of the thickness of the non-conformal work function metal layer 74L on the sidewalls of the gate dielectric layer 70L to the thickness of the non-conformal work function metal layer 74L on the horizontal portions of the gate dielectric layer 70L can be from 0 to 0.8, and preferably from 0 to 0.5. If this ratio is 0, which occurs if a highly directional deposition method such as vacuum evaporation with an angular beam spread less than about 2 degree is employed, the non-conformal work function metal layer 74L can be absent (i.e., less than one atomic layer thick) on the sidewalls of the gate dielectric layer 70L, and an isotropic etch of the non-conformal work function metal layer 74L, described below, may be omitted.

Figure 16:
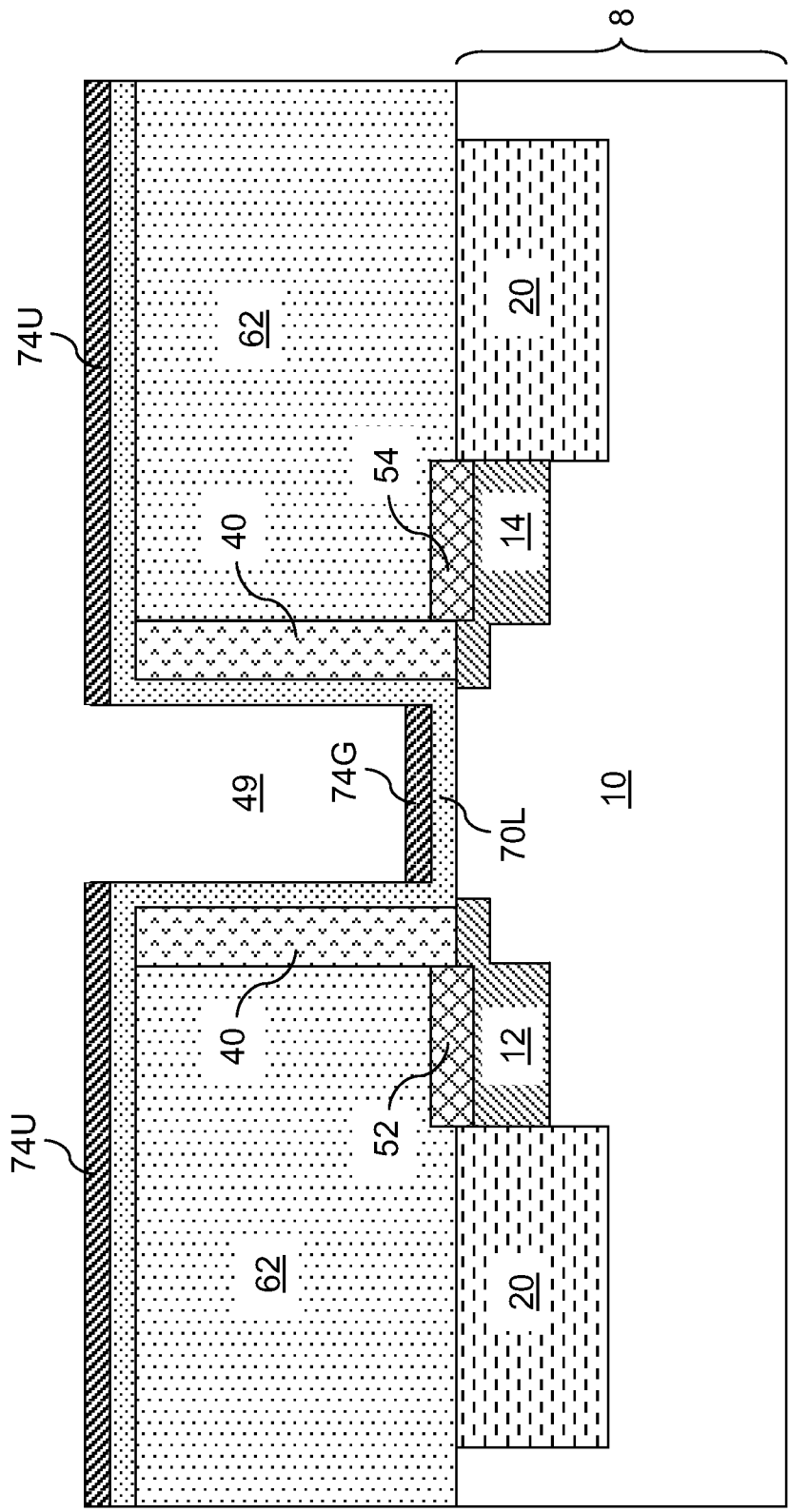
FIG. 16 is a vertical cross-sectional view of the third exemplary semiconductor structure of FIG. 15 after an isotropic etch that removes sidewall portions of the non-conformal work function metal layer and forms a work function metal portion on a horizontal portion of the high-k gate dielectric layer according to the third embodiment of the present disclosure.

Referring to FIG. 16, an isotropic etch or an etch including an isotropic component (i.e., an etch that is not 100% anisotropic) is employed to remove sidewall portions of the non-conformal work function metal layer 74L. A remaining portion of the work function metal layer 74L located on a horizontal portion of the gate dielectric layer 70L within the recessed region, i.e., within the gate cavity 49, is a work function metal portion 74G, and a remaining portion of the work function metal layer 74L located on the topmost surface of the gate dielectric layer 70L is a metallic liner 74U. The metallic liner 74U has the same composition and thickness as the work function metal layer 74L. The work function metal portion 74G is a gate component that is incorporated into a gate structure of a field effect transistor to be subsequently formed.

Sidewalls of vertical portions of the gate dielectric layer 70L are exposed over the work function metal portion 74G in the gate cavity 49. In one embodiment, the isotropic etch or the etch including an isotropic component is selective to the material of the gate dielectric layer 70L, and the exposed sidewall portions of the gate dielectric layer 40 can be substantially intact after the isotropic etch or the etch including the isotropic component.

Figure 17:
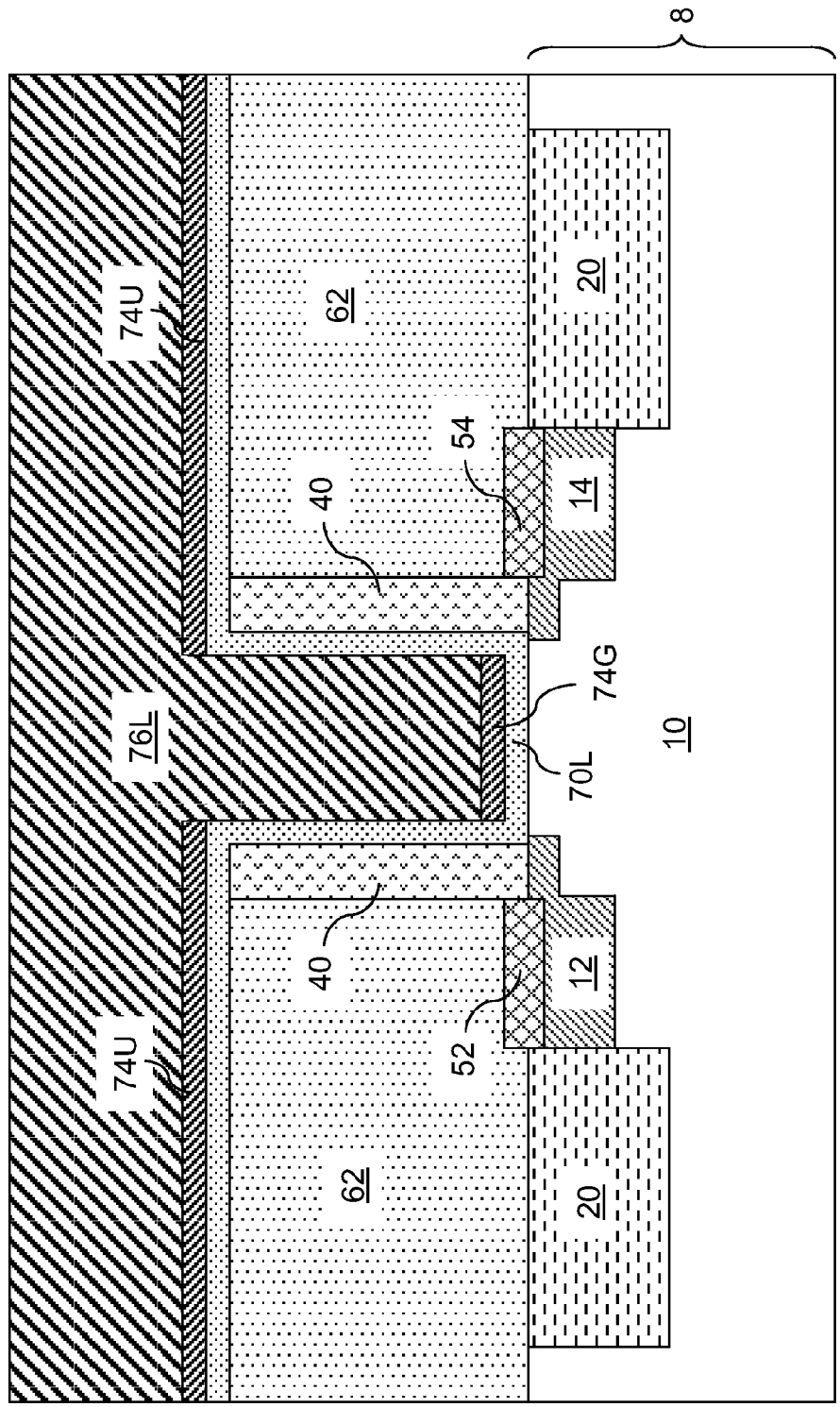
FIG. 17 is a vertical cross-sectional view of the third exemplary semiconductor structure of FIG. 16 after deposition of a conductive material layer according to the third embodiment of the present disclosure.

Referring to FIG. 17, a conductive material layer 76L is deposited to fill the gate cavity 49. The conductive material layer 76L of the third embodiment can have the same composition as the conductive material layer of the first embodiment, i.e., can have the same composition as the conductive material portion 76 of the first embodiment, and can be formed employing the same processing steps employed to deposit the conductive material layer of the first embodiment.

Figure 18:
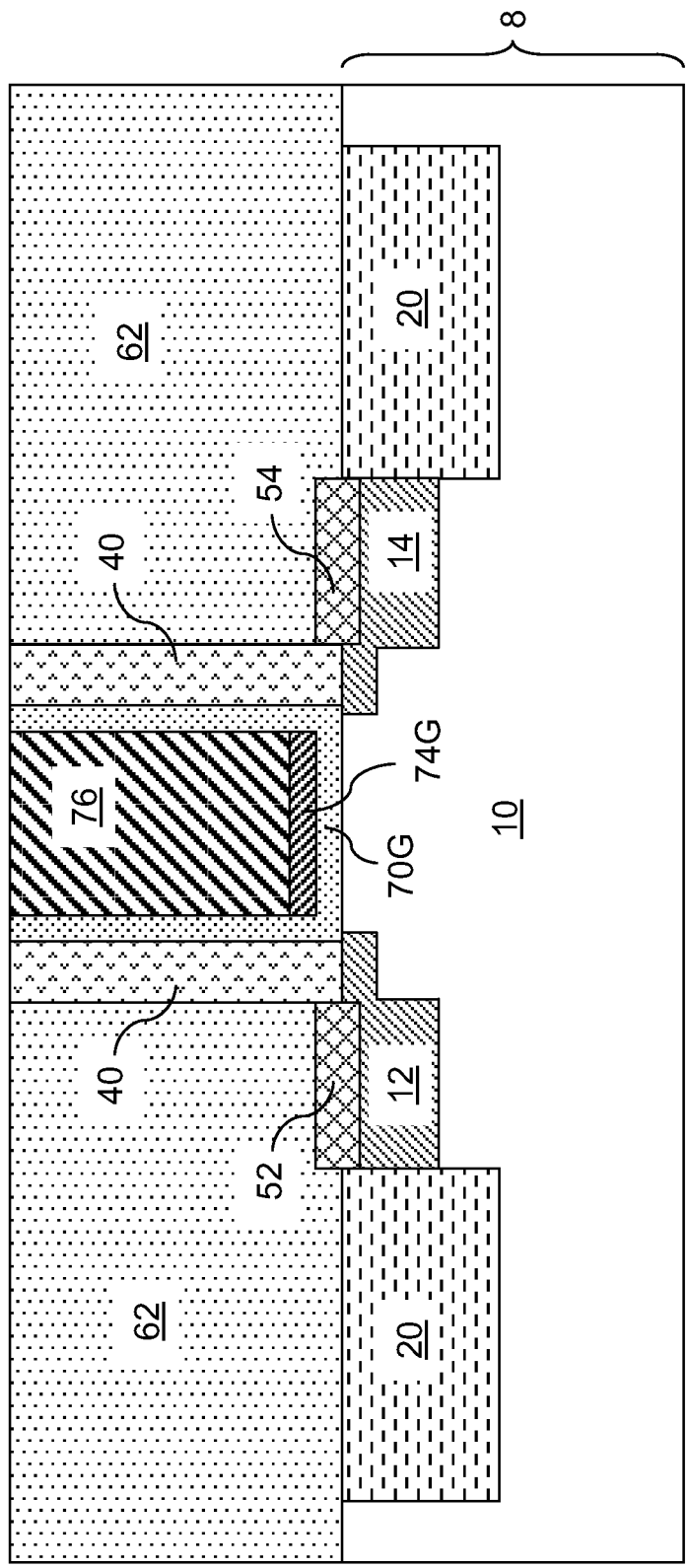
FIG. 18 is a vertical cross-sectional view of the third exemplary semiconductor structure of FIG. 17 after formation of a gate electrode according to the third embodiment of the present disclosure.

Referring to FIG. 18, the portion of the conductive material layer 76L above the top surface of the dielectric material layer 62 and the metallic layer 74U are removed by a planarization process, which can employ a recess etch, chemical mechanical planarization, or a combination thereof. A topmost surface of the dielectric material layer 62 is coplanar with the topmost surface of the remaining portion of the gate dielectric layer 70L, which is herein referred to as a gate dielectric 70G, and the topmost surface of the remaining portion of the conductive material layer 76L, which is herein referred to as a conductive material portion 76, and the topmost surface of the dielectric gate spacer 40. Variation of the third embodiment can also be practiced in which a portion of the gate dielectric layer 70L is present over the top surface of the dielectric material layer 62, and the topmost surface of the conductive material portion 76 is coplanar with the top surface of the portion of the gate dielectric layer 70L over the dielectric material layer 62.

The stack of the work function metal portion 74G and the conductive metal portion 76 collectively form a gate electrode (74G, 76). The sidewalls of the conductive metal portion 74G contact, and are vertically coincident with, a bottom portion of the inner sidewalls of the gate dielectric 70G. As used herein, an element is vertically coincident with another element if the element overlaps with, and is congruent with, the other element in a top-down view. The work function metal portion 74G has a planar top surface contacting, and having the same area as, a planar bottom surface of the conductive material portion 76. The gate dielectric 70G is U-shaped having a peripheral vertical portion that extent to the top surface of the gate electrode (74G, 76). The work function metal portion 74G is laterally separated from the dielectric gate spacer 40 by the vertical sidewall portion of the gate dielectric layer 70G.

Figure 19:
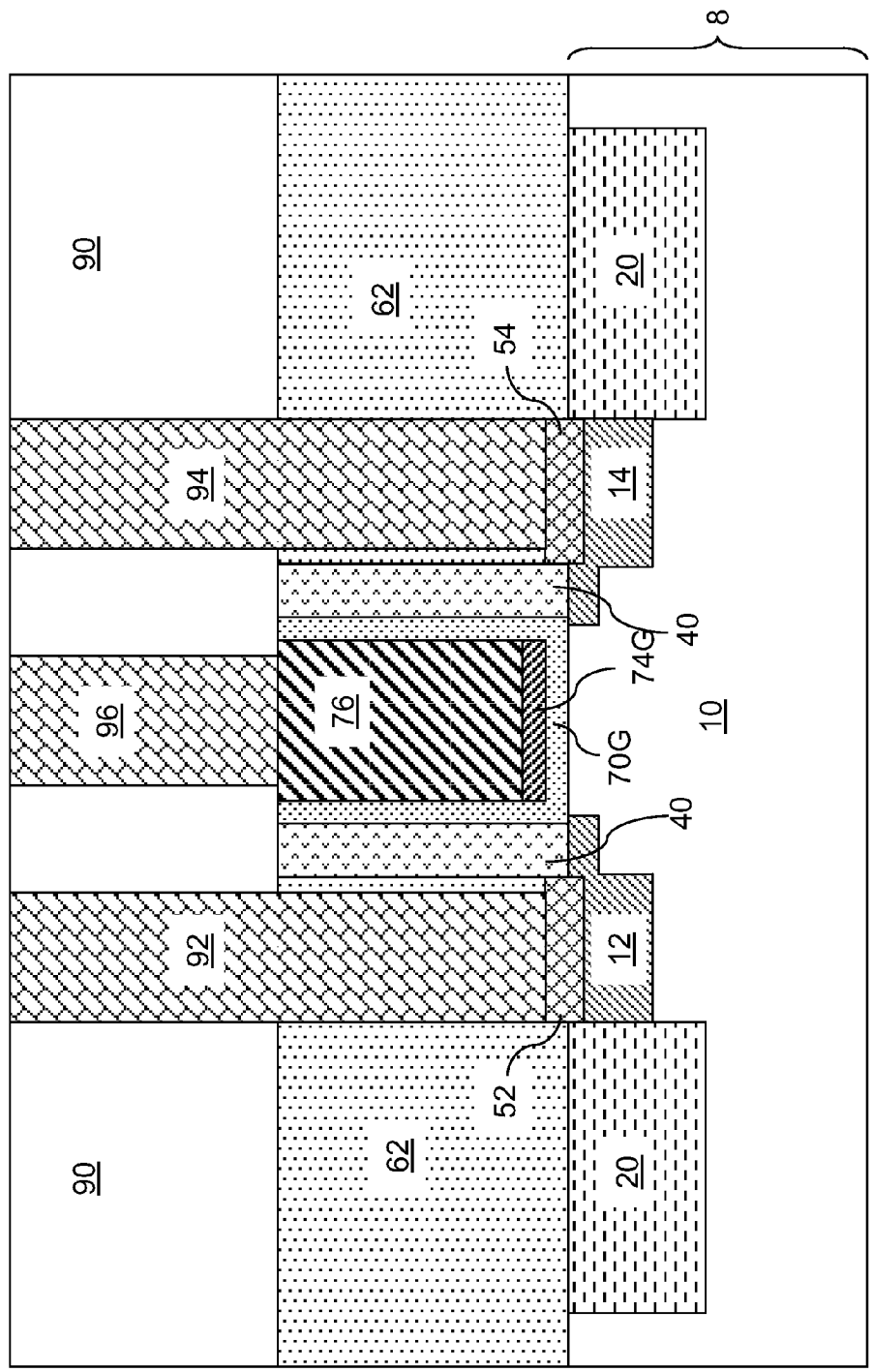
FIG. 19 is a vertical cross-sectional view of the third exemplary semiconductor structure of FIG. 18 after formation of conductive via structures according to the third embodiment of the present disclosure.

Referring to FIG. 19, the same processing steps as the processing steps of FIG. 10 according to the first embodiment can be employed to form at least one overlying dielectric material layer 90 and various conductive via structures (92, 94, 96).

Figure 20:
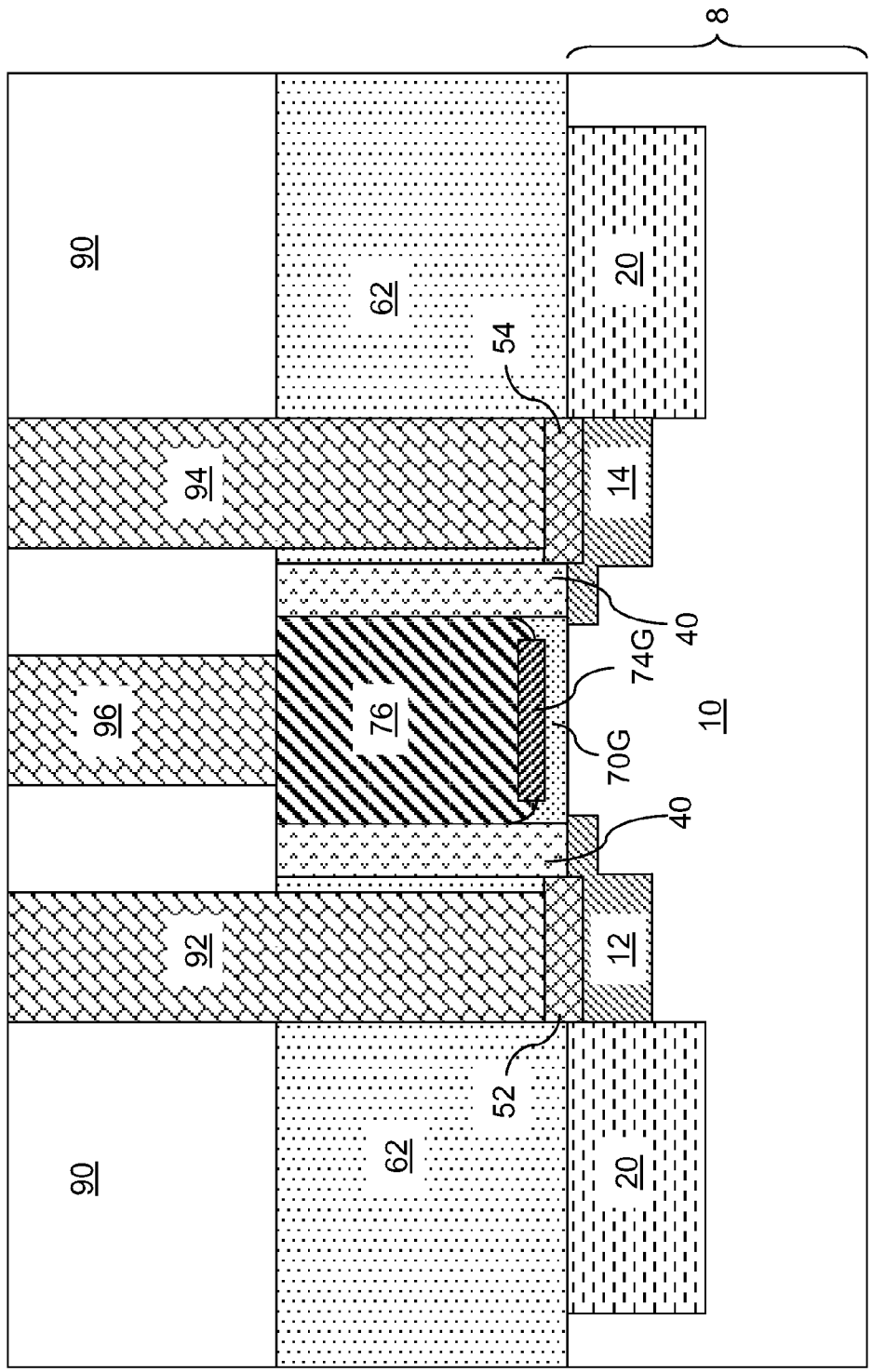
FIG. 20 is a vertical cross-sectional view of a fourth exemplary semiconductor structure according to a fourth embodiment of the present disclosure.

Referring to FIG. 20, a fourth exemplary semiconductor structure according to a fourth embodiment of the present disclosure can be derived from the third exemplary structure of FIG. 16 be performing an additional etch that selectively removes exposed sidewall portions of the gate dielectric layer 70L to form a gate dielectric 70G having geometrical features as the gate dielectric 70G of the first embodiment. The gate dielectric 70G is a first gate component that is formed from a remaining portion of a first continuous material layer, which is the gate dielectric layer 70L as shown in FIG. 16. The gate dielectric 70G is incorporated into a gate stack of a field effect transistor.

A conductive material layer 76L is deposited employing the same processing steps as in FIG. 17 according to the third embodiment. Subsequently, the processing steps of FIGS. 18 and 19 are performed in the same manner as in the third embodiment. Because the inner sidewalls of the dielectric gate spacer 40 are exposed by the etch that removes sidewall portions of the gate dielectric layer 70L, all sidewalls of a conductive material portion 76 contact the inner sidewalls of the dielectric gate spacer 40 in the fourth embodiment.

As in the first and second embodiments, the gate dielectric 70G of the fourth embodiment includes a horizontal portion and a peripheral portion. The peripheral portion has outer sidewalls that adjoin the entirety of the periphery of the horizontal portion. Further, the gate dielectric 70G includes inner sidewalls that contact lower portions of the sidewalls of the work function metal portion 74. The inner sidewalls and the outer sidewalls of the gate dielectric 70G protrude above a top planar surface of the horizontal portion of the gate dielectric 70G that is parallel to a bottom planar surface of the horizontal portion of the gate dielectric 70G. The entirety of the gate dielectric 70G is of unitary construction and may have a same composition throughout. The topmost portion of the peripheral portion of the gate dielectric 70G can include a contiguous concave surface that faces inward, i.e., toward the work function metal portion 74, and upward. The entirety of the contiguous concave surface of the topmost portion of the peripheral portion of the gate dielectric 70G can contact conductive material portion 76, and does not contact any portion of the work function metal portion 74.

The work function metal portion 74G of the fourth embodiment has a planar top surface contacting, and having a same area as, a planar bottom surface of the conductive material portion 76. Further, an upper portion of the sidewall surfaces of the work function metal portion 74G contacts the conductive material portion 76. A lower portion of the sidewall surfaces of the work function metal portion 74G contacts the gate dielectric 70G. The work function metal portion 74G is a second gate component that is formed from a remaining portion of a second continuous material layer, which is the non-conformal work function metal layer 74L as shown in FIG. 15. The work function metal portion 74G is also incorporated into a gate stack of the field effect transistor.

While the disclosure has been described in terms of specific embodiments, it is evident in view of the foregoing description that numerous alternatives, modifications and variations will be apparent to those skilled in the art. For example, though the present disclosure is described with exemplary structures including a field effect transistor and an antifuse structure, the present disclosure may be practiced without any field effect transistor. Accordingly, the disclosure is intended to encompass all such alternatives, modifications and variations which fall within the scope and spirit of the disclosure and the following claims.

What is claimed is:

1. A semiconductor structure comprising:
    a field effect transistor including a gate stack of a gate dielectric and a gate conductor, wherein said gate dielectric includes a dielectric material having a dielectric constant greater than 8.0 and includes a horizontal portion and a peripheral portion including sidewalls that protrude above a top planar surface of said horizontal portion and a concave surface that faces inward towards said horizontal portion; and
    a dielectric gate spacer including a dielectric material having a different composition than said gate dielectric and contacting sidewalls of said gate conductor,
    wherein a lower portion of inner sidewalls of said dielectric gate spacer laterally contacts said gate dielectric and an upper portion of said inner sidewalls of said dielectric gate spacer laterally contacts said gate conductor.

2. The semiconductor structure of claim 1, wherein the field effect transistor is present on a semiconductor substrate including a semiconductor material that is selected from the group consisting of silicon, silicon containing alloy, germanium containing alloy, III-V compound semiconductor, II-IV semiconductor and a combination thereof.

3. The semiconductor structure of claim 2, further comprising source regions and drain regions in the semiconductor substrate on opposing sides of the gate stack.

4. The semiconductor structure of claim 1, wherein the gate dielectric has a thickness of 10 nm or less.

5. The semiconductor structure of claim 1, further comprising at least one dielectric material layer laterally contacting said dielectric gate spacer and having a top surface that is coplanar with a top surface of said gate conductor.

6. The semiconductor structure of claim 1, wherein the horizontal portion and the peripheral portion are unitary and have a U-shaped geometry.

7. The semiconductor structure of claim 1, wherein the peripheral portion does not extend along an entirety of the sidewalls of the gate conductor.

8. The semiconductor structure of claim 1, wherein the gate conductor includes a work function metal portion.

* * * * *